United States Patent
Jeong et al.

(10) Patent No.: US 11,874,784 B2
(45) Date of Patent: Jan. 16, 2024

(54) MEMORY DEVICE PERFORMING SELF-CALIBRATION BY IDENTIFYING LOCATION INFORMATION AND MEMORY MODULE INCLUDING THE SAME

(71) Applicant: SAMSUNG ELECTRONICS CO., LTD., Suwon-si (KR)

(72) Inventors: Heon Su Jeong, Hwaseong-si (KR); Hangi Jung, Hwaseong-si (KR); Wangsoo Kim, Seoul (KR); Hae Young Chung, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/089,148

(22) Filed: Dec. 27, 2022

(65) Prior Publication Data

US 2023/0131945 A1 Apr. 27, 2023

Related U.S. Application Data

(63) Continuation of application No. 17/008,121, filed on Aug. 31, 2020, now Pat. No. 11,567,886.

(30) Foreign Application Priority Data

Nov. 12, 2019 (KR) .......................... 10-2019-0144108

(51) Int. Cl.
*G06F 13/16* (2006.01)
*G06F 13/40* (2006.01)
(Continued)

(52) U.S. Cl.
CPC ...... *G06F 13/1673* (2013.01); *G06F 13/4086* (2013.01); *G11C 7/1048* (2013.01); *G11C 7/1057* (2013.01); *G11C 7/1084* (2013.01); *G11C 7/1096* (2013.01); *G11C 7/222* (2013.01); *G11C 7/225* (2013.01); *G11C 8/18* (2013.01); *G11C 2207/2254* (2013.01)

(58) Field of Classification Search
CPC ............ G06F 13/1673; G06F 13/4086; G11C 7/1048; G11C 7/1057; G11C 7/1084; G11C 7/1096; G11C 7/222; G11C 7/225; G11C 8/18; G11C 2207/2254
See application file for complete search history.

(56) References Cited

U.S. PATENT DOCUMENTS 6,256,235 B1 7/2001 Lee
7,675,316 B2 3/2010 Lim et al.
(Continued)

FOREIGN PATENT DOCUMENTS

KR 100684904 B1 2/2007

*Primary Examiner* — Idriss N Alrobaye
*Assistant Examiner* — Richard B Franklin
(74) *Attorney, Agent, or Firm* — Sughrue Mion, PLLC

(57) ABSTRACT

A memory device of a memory module includes a CA buffer that receives a command/address (CA) signal through a bus shared by a memory device different from the memory device of the memory module, and a calibration logic circuit that identifies location information of the memory device on the bus. The memory device recognizes its own location on a bus in a memory module to perform self-calibration, and thus, the memory device appropriately operates even under an operation condition varying depending on a location in the memory module.

19 Claims, 14 Drawing Sheets

(51) Int. Cl.
*G11C 7/22* (2006.01)
*G11C 7/10* (2006.01)
*G11C 8/18* (2006.01)

(56) References Cited

U.S. PATENT DOCUMENTS

| | | | |
|---|---|---|---|
| 9,166,583 B2 | 10/2015 | Oh et al. | |
| 9,292,391 B2 | 3/2016 | Ojalvo et al. | |
| 9,563,597 B2* | 2/2017 | Ware | G06F 13/161 |
| 9,747,230 B2 | 8/2017 | Han et al. | |
| 9,871,518 B2* | 1/2018 | Chen | G11C 11/4074 |
| 9,978,460 B2 | 5/2018 | Kang et al. | |
| 10,141,935 B2* | 11/2018 | Bains | H03K 19/017545 |
| 11,238,909 B2 | 2/2022 | Durai et al. | |
| 2015/0006826 A1 | 1/2015 | Yong | |
| 2017/0011784 A1 | 1/2017 | Berge et al. | |
| 2018/0322914 A1 | 11/2018 | Wu et al. | |
| 2019/0036531 A1 | 1/2019 | Bains et al. | |
| 2019/0156877 A1 | 5/2019 | Chan-kyung et al. | |
| 2021/0050041 A1* | 2/2021 | Durai | G11C 29/50008 |

\* cited by examiner

MEMORY DEVICE PERFORMING SELF-CALIBRATION BY IDENTIFYING LOCATION INFORMATION AND MEMORY MODULE INCLUDING THE SAME

CROSS-REFERENCE TO RELATED APPLICATIONS

This application is a Continuation of U.S. application Ser. No. 17/008,121 filed Aug. 31, 2020, which claims priority under 35 U.S.C. § 119 to Korean Patent Application No. 10-2019-0144108 filed on Nov. 12, 2019, in the Korean Intellectual Property Office, the disclosures of which are incorporated by reference herein in their entireties.

BACKGROUND

Example embodiments of the present disclosure relate to a memory device performing self-calibration by identifying location information and a memory module including the same.

A memory module is a printed circuit board on which one or more memory devices are mounted. The memory module may be used in various computing systems such as a server, a workstation, and a personal computer. As operating speeds of the memory module and the memory devices mounted on the memory module gradually increase, various calibration or training operations may be performed on a memory device. Due to a standard, size, a wire space, etc. of the memory module, a bus including a plurality of transmission paths may be shared to access a plurality of memory devices in the memory module. However, locations of the plurality of memory devices placed on the bus in the memory module may be different.

Calibration is a process of determining a deviation from a standard and determining correction factors in order to reduce, remove, or compensate for the deviations. Calibration can include adjusting a particular function to improve effectiveness.

Training is a process of teaching to make fit, qualified or proficient. Training can reduce, remove, or compensate for mistakes that would occur had the training not been performed.

SUMMARY

Example embodiments provides a memory device performing self-calibration by identifying location information and a memory module including the same.

According to an aspect of an example embodiment, there is provided a memory device of a memory module, the memory device comprising: a command/address (CA) buffer configured to receive a CA signal through a bus shared by a second memory device that is different from the memory device of the memory module; and a calibration logic circuit configured to identify location information of the memory device on the bus.

According to an aspect of an example embodiment, there is provided a memory device of a memory module, the memory device including: a command/address (CA) buffer configured to receive a CA signal through a bus shared by a second memory device that is different from the memory device of the memory module; an equalizer configured to compensate for the CA signal received the CA buffer through the bus; and a calibration logic circuit configured to identify location information of the memory device, wherein the location information indicates a transmission length of the bus measured from a CA pin of the memory module to the CA buffer, and to adjust the equalizer based on the location information.

According to an aspect of an example embodiment, there is provided a memory module including: a first memory device; and a second memory device sharing a bus with the first memory device, wherein the first memory device includes a first command/address (CA) buffer configured to receive a CA signal through the bus; and a first calibration logic circuit configured to identify first location information of the first memory device on the bus, and wherein the second memory device includes a second CA buffer configured to receive the CA signal through the bus, and a second calibration logic circuit configured to identify second location information of the second memory device on the bus.

BRIEF DESCRIPTION OF THE FIGURES

The above and other aspects will become apparent by describing in detail example embodiments with reference to the accompanying drawings, in which.

DETAILED DESCRIPTION

Figure 1:
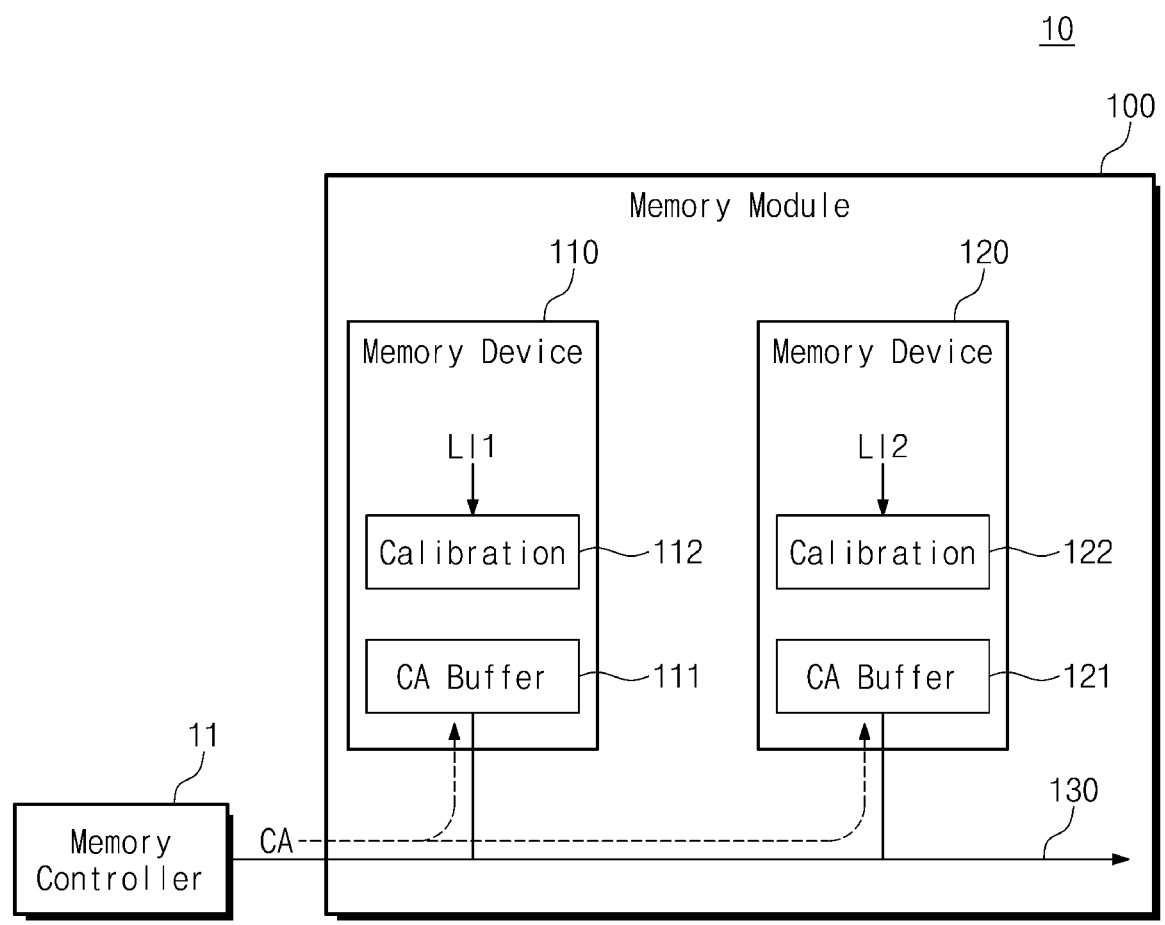
FIG. 1 illustrates a block diagram of a memory module according to an example embodiment.

FIG. 1 illustrates a block diagram of a computing system according to an example embodiment. A computing system 10 may be also referred to as an "electronic system" or a "memory system" and may be implemented at an electronic device. The computing system 10 may include a memory controller 11 and a memory module 100. The memory controller 11 may control the memory module 100 in response to a request of a processor supporting various applications, such as a server application, a personal computer (PC) application, and a mobile application. For example, the memory controller 11 may transmit a CA signal to the memory module 100. In the specification, "CA" may mean a command and an address or a command/address. For example, the CA signal may constitute a command or an address for accessing memory devices 110 and 120.

The memory module 100 may include the memory devices 110 and 120 and a bus 130. The memory device 110 may include a CA buffer 111 and a calibration logic circuit 112. The memory device 120 may include a CA buffer 121 and a calibration logic circuit 122. The bus 130 may include a path through which the CA signal is transmitted to the memory devices 110 and 120. For example, the bus 130 may be also referred as to a "CA bus." The memory devices 110 and 120 may be connected to the bus 130 and may share the bus 130. The CA buffers 111 and 121 may receive the same CA signal through the bus 130. The memory devices 110 and 120 may be connected in common with one bus 130 in a multi-drop manner or a multi-point manner. For example, through the bus 130, the CA signal may be transmitted in a direction from the memory device 110 to the memory device 120, and the memory device 110 may receive the CA signal to be earlier than the memory device 120. The memory controller 11 may transmit the CA signal to the memory devices 110 and 120 by using a fly-by topology, but a flight time skew may be present between the memory devices 110 and 120. A memory device may be also referred to as a "memory chip."

The calibration logic circuit 112 may identify (or recognize, check, determine, etc.) location information LI1 of the memory device 110 on the bus 130. The calibration logic circuit 122 may identify (or recognize, check, determine, etc.) location information LI2 of the memory device 120 on the bus 130. That is, the memory devices 110 and 120 may respectively identify the location information LI1 and LI2 on one's own. The location information LI1 may be provided to the calibration logic circuit 112, and the location information LI2 may be provided to the calibration logic circuit 122. The location information may be determined by a particular memory device based on evaluating a circuit at a response connected to a particular resistor. The value of the particular resistor may be a function of the location of the particular memory device on the bus. The particular resistor is installed with the particular memory device at the particular location at the time of fabrication of a circuit board on which the memory devices 110 and 120 are mounted. In another embodiment, parasitic resistance of the bus 130 may be used to determine the location information without any resistor.

As mentioned above, the memory devices 110 and 120 may respectively identify the location information LI1 and LI2 on their own. Generally, this identification by the calibration logic circuit 112 may occur by use of a pin voltage level (for example, related to a resistor electrically connected to a pin of the memory device 110), ID information in a register of the memory device 110, or information programmed in a fuse array of the memory device 110. Identification by the calibration logic circuit 122 may also occur by use of a pin voltage level of the memory device 120, second ID information in a register of the memory device 120, or information programmed in a fuse array of the memory device 120. In another embodiment, voltage drops on the bus may be different on the memory devices 110 and 120 because the memory devices 110 and 120 are on different locations of the bus 130 and the parasitic resistance causes an increasing voltage drop along an increasing distance on the bus 130. The different voltage drops may be used to identify the location information LI1 and LI2.

A purpose of the calibration is to allow effective reading and writing of data on the high speed bus. As bus speeds increase and power supply voltages decrease, waveform edges become less clear and it is possible to mistake a "0" for a "1" or a "1" for a "0." The shape of the waveform edge depends on physical location on the bus, because the waveform shape depends on travel of signals along the bus. Embodiments provided herein reduce, remove, or compensate for such mistakes. Thus, by calibration or training as a function of location on the bus, the effectiveness of reading or writing data can be increased by reducing occurrence of such mistakes.

As one example, effectiveness may be increased by using a receiver to sample DQS signals driven by a transmitter of the memory controller. In this example, the receiver provides a signal to a write levelling circuit and the writing leveling circuit is configured to know the location information by one of the approaches described herein. One example embodiment is provided by FIG. 6 elements 1303 (receiver), 1306 (transmitter) and 1304 (write levelling).

The calibration logic circuit 112 may perform a calibration operation (or a training operation) on an operation of the memory device 110 by using the location information LI1 and may adjust operation parameters of the memory device 110.

In some embodiments, for example, a delay lock loop may determine a timing adjustment which optimally samples data on a bus based on location. For example, the timing adjustment may be a function of the location information LI1. This adjustment may referred to as training or calibration. The calibration logic circuit 122 may perform a calibration operation (or a training operation) on an operation of the memory device 120 by using the location information LI2 and may adjust operation parameters of the memory device 120. In the example above, a delay lock loop may determine a timing adjustment which optimally samples data on the bus as function of the location information LI2.

For example, the location information LI1 and the location information LI2 may be different. The location information LI1 may indicate that a location of the memory device 110 on the bus 130 is relatively close to the memory controller 11, and the location information LI2 may indicate that a location of the memory device 120 on the bus 130 is relatively distant from the memory controller 11. The location information LI1 may indicate a distance of the bus 130 between the memory device 110 and the memory controller 11 or may indicate a distance from a pin through which the memory module 100 receives the CA signal to the CA buffer 111. The location information LI2 may indicate a distance of the bus 130 between the memory device 120 and the memory controller 11 or may indicate a distance from a pin through which the memory module 100 receives the CA signal to the CA buffer 121. For another example, the memory device 110 and the memory device 120 may be adjacent to each other, and the location information LI1 and the location information LI2 may be identical.

Figure 2:
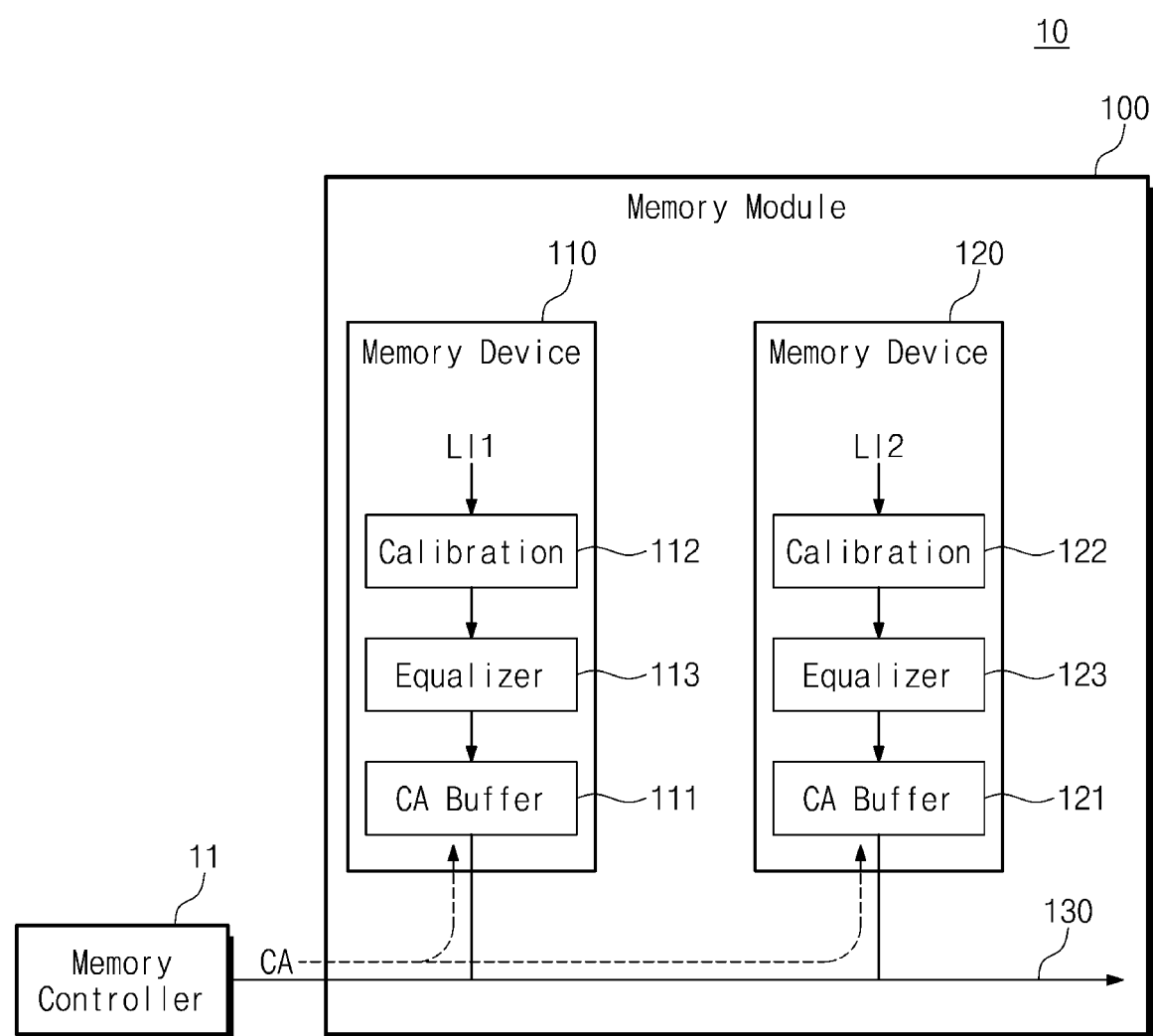
FIG. 2 illustrates a block diagram of a memory module of FIG. 1 in detail.

FIG. 2 illustrates a block diagram of a memory module of FIG. 1 in detail. The memory device 110 may further include an equalizer 113, and the memory device 120 may further include an equalizer 123. The equalizer 113 may recover the CA signal that is transmitted through the bus 130 and is received or sampled by the CA buffer 111. The bus 130 may be a channel such as a coaxial cable or a PCB trace. Accordingly, in the case where the CA signal is transmitted through the bus 130 at high speed, a bandwidth of the bus 130 may be limited due to a load, a surface effect, and a dielectric loss of the bus 130, an intersymbol interference (ISI), etc., and a high-frequency component of the CA signal on the CA buffer 111 may weaken. The equalizer 113 may boost or reinforce the high-frequency component of the CA signal received by the CA buffer 111. The equalizer 113 may have a frequency response such as a high pass filter unlike the bus 130 having a frequency response such as a low pass filter. As in the equalizer 113, the equalizer 123 may boost the high-frequency component of the CA signal received by the CA buffer 121.

The calibration logic circuit 112 may adjust the equalizer 113 by using the location information LI1 of the memory device 110 on the bus 130. The calibration logic circuit 122 may adjust the equalizer 123 by using the location information LI2 of the memory device 120 on the bus 130. For example, when the location information LI1 and the location information LI2 are different, the degree to which the calibration logic circuit 112 adjusts the equalizer 113 and the degree to which the calibration logic circuit 122 adjusts the equalizer 123 may be different. The degree to which the equalizer 113 adjusted by the calibration logic circuit 112 amplifies the high-frequency component of the CA signal received by the CA buffer 111 and the degree to which the equalizer 123 adjusted by the calibration logic circuit 122 amplifies the high-frequency component of the CA signal received by the CA buffer 121 may be different. For another example, the calibration logic circuits 112 and 122 may decide whether to enable the equalizers 113 and 123 by using the location information LI1 and LI2, respectively. For another example, when the location information LI1 and the location information LI2 are identical, the degree to which the calibration logic circuit 112 adjusts the equalizer 113 and the degree to which the calibration logic circuit 122 adjusts the equalizer 123 may be identical.

Figure 3:
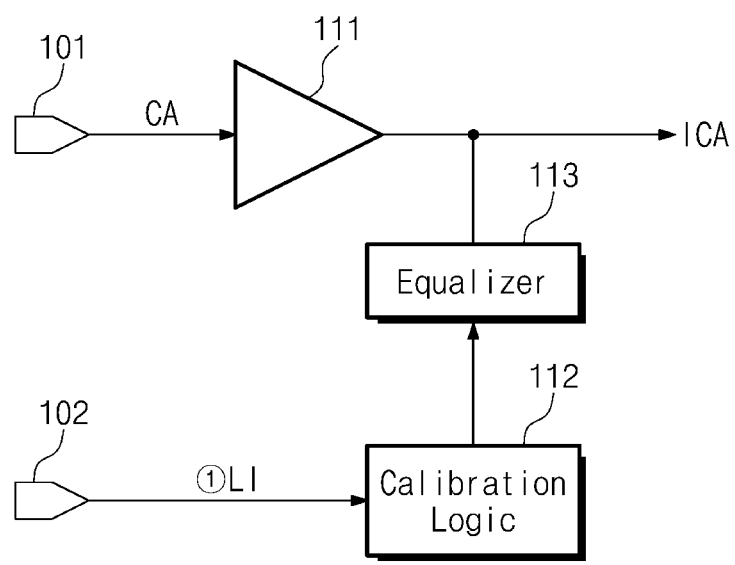
FIGS. 3, 4, and 5 illustrate block diagrams of a memory device of FIG. 2, respectively.
Figure 4:
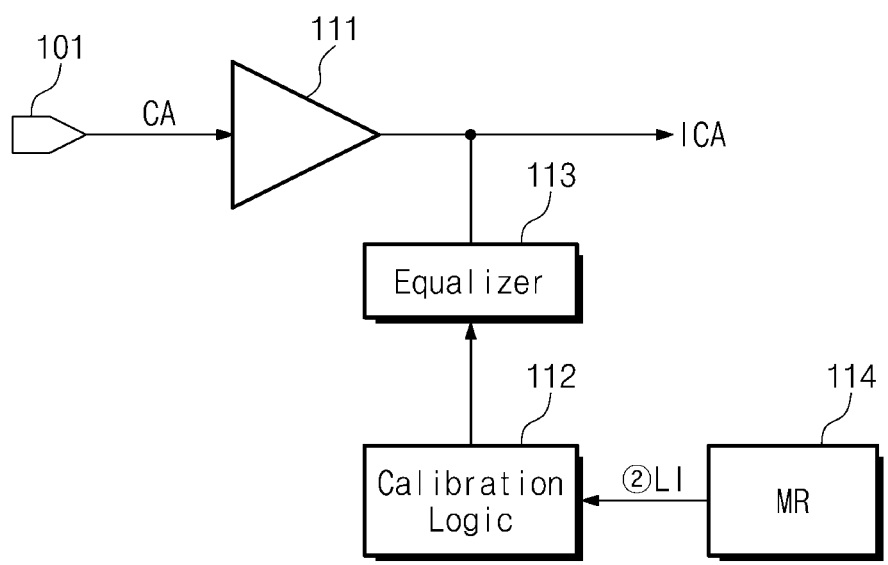
Figure 5:
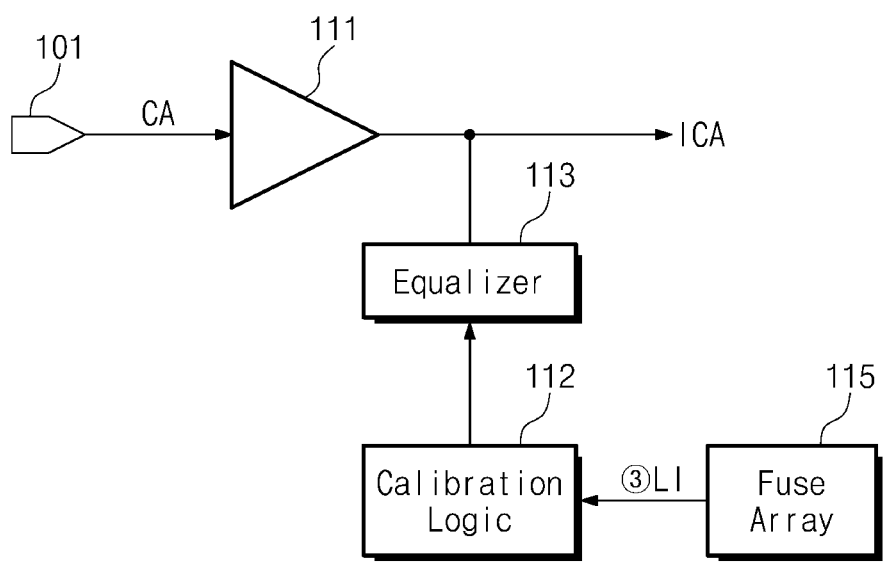

FIGS. 3, 4 and 5 illustrate block diagrams of a memory device of FIG. 2, respectively. FIGS. 3 to 5 will be described with reference to FIGS. 1 and 2 together, and memory devices 110_1 to 110_3 may be examples of the memory device 110/120. The memory device 120 may be implemented to be substantially identical to as the memory device 110. Referring to FIGS. 3 to 5, in the respective memory devices 110_1 to 110_3, the CA buffer 111 may receive the CA signal through a CA pin 101 and may output the received CA signal as an internal CA signal ICA. The equalizer 113 may restore a high-frequency component of the internal CA signal ICA. The calibration logic circuit 112 may adjust the equalizer 113 by using the location information LI1. Referring to FIG. 3, the calibration logic circuit 112 may identify the location information LI of the memory device 110_1 on the bus 130 by checking a voltage level input through a pin 102 (①). The voltage level may be a power supply voltage level or a ground voltage level of the memory device 110_1, or any voltage level between the power supply voltage level and the ground voltage level. For another example, the number of pins 102 may be two or more, and the calibration logic circuit 112 may identify the location information LI of the memory device 110_1 on the bus 130 by decoding a plurality of voltage levels input through the pins 102. Referring to FIG. 4, the memory device 110_2 may include a mode register 114. The mode register 114 may store various information about an operation condition of the memory device 110_2 depending on a request of the memory controller 11. For example, the memory controller 11 may write various values including location information in the mode register 114 by issuing a mode register write command MRW or a mode register set command MRS. The calibration logic circuit 112 may identify the location information LI of the memory device 110_2 on the bus 130 by using the location information LI stored in the mode register 114 (②). Referring to FIG. 5, the memory device 110_3 may include a fuse array 115. The fuse array 115 may store various information about an operation condition of the memory device 110_2. For example, information indicating a location of the memory module 100, at where the memory device 110_3 is mounted, that is, location information of the memory device 110_3 on the bus 130 may be in advance programmed in the fuse array 115. The calibration logic circuit 112 may identify the location information LI of the memory device 110_3 on the bus 130 by using the location information LI stored in the fuse array 115 (③).

Figure 6:
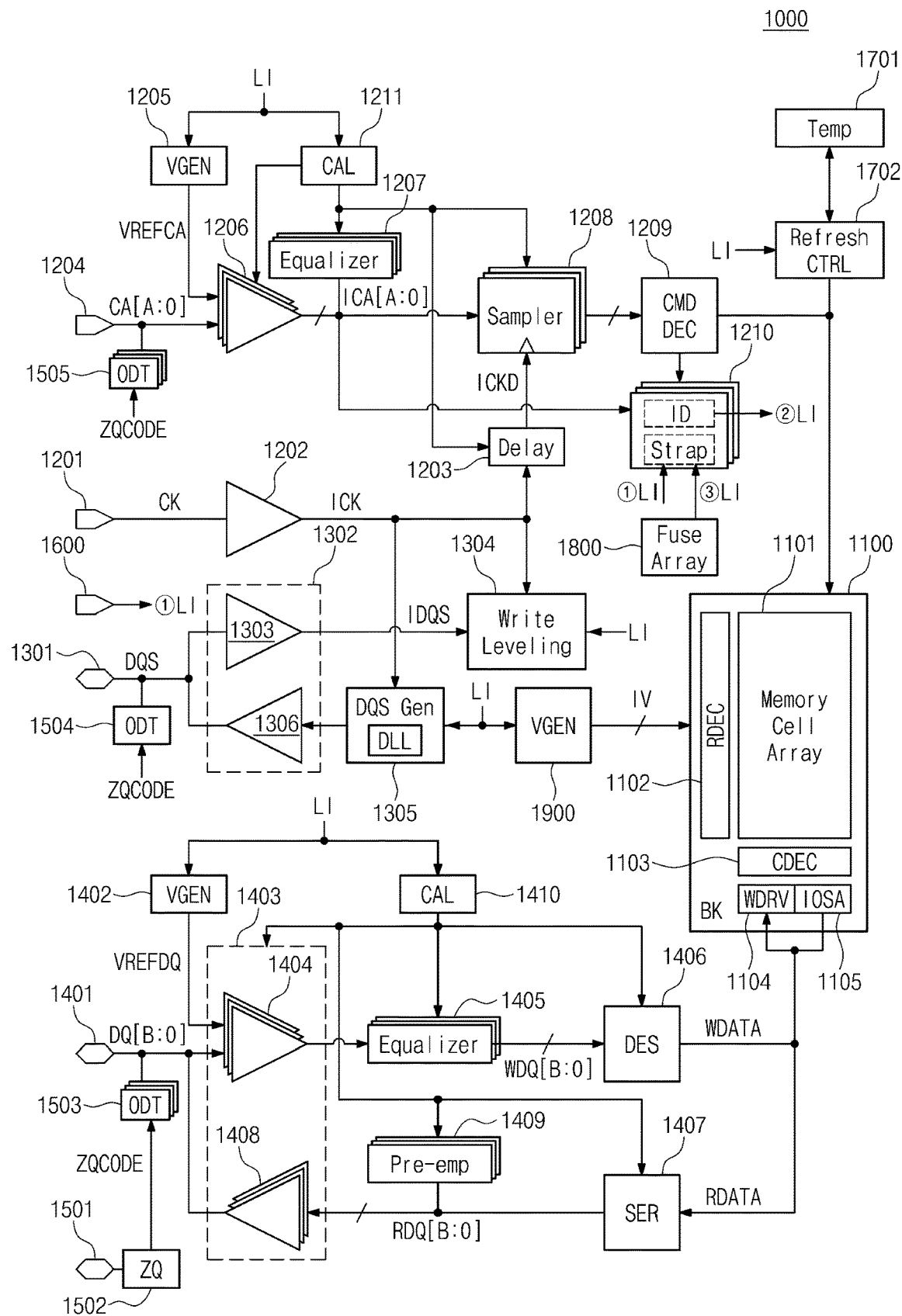
FIG. 6 illustrates a block diagram of a memory device of FIGS. 1 to 5.

FIG. 6 illustrates a block diagram of a memory device of FIGS. 1 to 5. A memory device 1000 may be an example of the memory device 110/120 described above. The memory device 1000 may include a bank 1100. The bank 1100 may include a memory cell array 1101, a row decoder 1102, a column decoder 1103, a write driver 1104, and an input/output sense amplifier 1105. The memory cell array 1101 may include memory cells that are selected by the row decoder 1102 and the column decoder 1103 and are connected with word lines and bit lines. For example, each of the memory cells may be one of a static random access memory (SRAM) cell, a dynamic random access memory (DRAM) cell, a thyristor random access memory (TRAM) cell, a NAND flash memory cell, a NOR flash memory cell, a resistive random access memory (RRAM) cell, a ferroelectric random access memory (FRAM) cell, a phase change random access memory (PRAM) cell, and a magnetic random access memory (MRAM) cell, or the memory cells may be implemented with a combination of the above cells.

The row decoder 1102 may decode a row address included in CA signals CA[A:0] (A being a natural number), may enable a word line(s) corresponding to the row address, and may select memory cells connected with the word line. The column decoder 1103 may decode a column address included in the CA signals CA[A:0], may enable a column selection line(s) corresponding to the column address, and may select memory cells connected with bit lines connected with the column selection line. The write driver 1104 may write "write data" to memory cells selected by the row decoder 1102 and the column decoder 1103. The input/output sense amplifier 1105 may sense and amplify read data from the selected memory cells. The number of banks 1100 may be one or more, and a plurality of banks 1100 may constitute a bank group.

The memory device 1000 may further include a clock pin 1201, a clock buffer 1202, a delay circuit 1203, CA pins 1204, a voltage generator 1205, CA buffers 1206, equalizers 1207, samplers 1208, a command decoder 1209, mode registers 1210, and a calibration logic circuit 1211. The clock pin 1201 may be connected with one path of a CA bus corresponding to the bus 130 and may receive a clock signal CK (e.g., the CA bus may be also referred to as a "CK/CA bus"). The clock buffer 1202 may be a receiver that may receive the clock signal CK through the clock pin 1201, may amplify the received clock signal CK, and may generate an internal clock signal ICK. The clock buffer 1202 may further receive a complementary clock signal CKb through a complementary clock pin connected with another path of the CA bus. The delay circuit 1203 may delay the internal clock signal ICK and may generate a delay clock signal ICKD.

The CA pins 1204 may be respectively connected with a plurality of paths of the CA bus corresponding to the bus 130 and may receive the CA signals CA[A:0]. As described above, the CA signals CA[A:0] may include various commands (e.g., an active command ACT, a precharge command PRE, an auto refresh command AREF, a self-refresh command SREF, a write command WR, a read command RD, a mode register write command MRW, a mode register set command MRS, a mode register read command MRR, and a multi-purpose command MPC) associated with the memory device 1000, a bank address indicating the bank 1100, a row address and a column address respectively indicating a word line and a column selection line of the memory cell array 1101, etc. The voltage generator 1205 may generate a reference voltage VREFCA and may provide the reference voltage VREFCA to the CA buffers 1206.

The CA buffers 1206 may receive the CA signals CA[A:0] through the CA pins 1204. The CA buffers 1206 may compare voltage levels of the CA signals CA[A:0] with a level of the reference voltage VREFCA, respectively. For example, the reference voltage VREFCA may be an internal voltage that is used to determine the voltage levels of the CA signals CA[A:0] corresponding to logical values. The CA buffers 1206 may amplify the CA signals CA[A:0] based on the reference voltage VREFCA and may respectively provide internal CA signals ICA[A:0] to the samplers 1208. Each of the CA buffers 1206 may correspond to the CA buffer 111/121 described with reference to FIGS. 1 to 5. The equalizers 1207 may compensate for or recover high-frequency components of the CA signals CA[A:0] input to the CA buffers 1206 through the CA bus and the CA pins 1204, respectively. Each of the equalizers 1207 may correspond to the equalizer 113/123 described with reference to FIGS. 2 to 5. The samplers 1208 may respectively sample the internal CA signals ICA[A:0] based on the delay clock signal ICKD. The samplers 1208 may sample logical values of the CA signals CA[A:0] at a rising edge or a falling edge of the clock signal CK. For example, the samplers 1208 may be flip-flops that latch, hold, and store sample logical values of the CA signals CA[A:0] at a rising edge or a falling edge of the delay clock signal ICKD.

The command decoder 1209 may receive logical values of the CA signals CA[A:0] sampled by the samplers 1208 and may decode a command(s) included in the CA signals CA[A:0]. For example, the command decoder 1209 may control the bank 1100 based on a decoding result. The command decoder 1209 may respectively provide a row address and a column address of the CA signals CA[A:0] to the row decoder 1102 and the column decoder 1103, based on the decoding result. An example is illustrated in FIG. 6 as the command decoder 1209 controls the bank 1100, but the command decoder 1209 may further control any other components of the memory device 1000 illustrated in FIG. 6, as well as the bank 1100.

An operation of the mode registers 1210 may be similar to the operation of the mode register 114 of FIG. 4. The mode registers 1210 may store an operand, an operation code, data, etc. included in the CA signals CA[A:0] associated with an operation condition of the memory device 1000, under control of the command decoder 1209 decoding the mode register write command MRW or the mode register set command MRS. Information stored in the mode registers 1210 may be output to the memory controller 11 under control of the command decoder 1209 decoding the mode register read command MRR. For example, information stored in the mode registers 1210 may be included in DQ signals DQ[B:0] (B being a natural number) so as to be output through DQ pins 1401.

In an example embodiment, a part of the mode registers 1210 may store the location information LI input through a pin 1600 of the memory device 1000 (①). The pin 1600 may be substantially identical to the pin 102 of FIG. 3, and the location information LI input through the pin 1600 may be substantially identical to the location information LI input through the pin 102. For example, a part of the mode registers 1210 may store the location information LI as a CA on-die termination (ODT) strap value. The memory controller 11 may read the CA ODT strap value stored in the mode registers 1210 by issuing the mode register read command MRR and may know a location of the memory device 1000 on the bus 130 in the memory module 100 by identifying the CA ODT strap value.

In another example embodiment, the rest of the mode registers 1210 may store identification (ID) information about the memory device 1000. The memory controller 11 may generate the mode register write command MRW and the ID information. The ID information stored in the rest of the mode registers 1210 may be used as the location information LI (②). The location information LI corresponding to the ID information may be substantially identical to the location information LI of FIG. 4. The mode register 1210 storing the location information LI (①) input through the pin 1600 and the mode register 1210 storing the ID information as the location information LI (②) are different and have different mode register addresses. The CA signals CA[A:0] may include the mode register write command MRW and the ID information. To prevent the same ID information from being written in the mode registers 1210 of the different memory devices 110 and 120 as the CA signals CA[A:0] are transmitted to the respective memory devices 110 and 120 through the bus 130, the memory controller 11 may allow the memory device 1000 to enter a per DRAM addressability (PDA) mode. For example, the memory devices 110 and 120 may share the CA bus but do not share a DQ bus (or a data input/output bus) (to be described later) through which the DQ signals DQ[B:0] are transmitted. A DQ bus for the memory device 110 and a DQ bus for the memory device 120 may be respectively provided between the memory controller 11 and the memory module 100. The memory controller 11 may allow the memory devices 110 and 120 to enter the PDA mode, may transmit the CA signals CA[A:0] including the mode register write command MRW and the ID information of the memory device 110 to each of the memory devices 110 and 120 through the bus 130, may transmit a DQ signal DQ[0] having a first logical value (e.g., low) and the DQ signals DQ[B:1] having a second logical value (e.g., high) to the memory device 110, and may transmit the DQ signals DQ[B:0] having the second logical value to the memory device 120. The command decoder 1209 of the memory device 110 may check the first logical value of the DQ signal DQ[0] and may validly process the mode register write command MRW of the memory controller 11. In contrast, the command decoder 1209 of the memory device 120 may check the second logical value of the DQ signal DQ[0] and may not process the mode register write command MRW of the memory controller 11. The memory controller 11 may store pieces of different ID information in the mode registers 1210 of the memory devices 110 and 120 by using the PDA mode.

In another example embodiment, a part of the mode registers 1210 may store the location information LI programmed in advance in a fuse array 1800 (③). The location information LI programmed in advance in the fuse array 1800 may be substantially identical to the location information LI programmed in the fuse array 115 of FIG. 5. A part of the mode registers 1210 may store the above location information LI as a CA ODT strap value. For example, in the case where the location information LI is in advance programmed in the fuse array 1800, the memory device 1000 may not include the pin 1600. For another example, in the case where the location information LI is input through the pin 1600, the location information LI may not be programmed in advance in the fuse array 1800. To sum up, the memory device 1000 may identify the location information LI through the pin 1600 (①), may identify the ID information transmitted from the memory controller 11 as the location information LI (②), or may identify the location information LI programmed in advance in the fuse array 1800 (③).

The calibration logic circuit 1211 may adjust the equalizers 1207 by using the location information LI1, respectively. The calibration logic circuit 1211 may identify the location information LI, may check whether a location of the memory device 1000 on the bus 130 is relatively close to the memory controller 11 or is relatively distant from the memory controller 11, and may differently adjust the equalizers 1207 depending on the location information LI. When the location of the memory device 1000 on the bus 130 is relatively close to the memory controller 11, the calibration logic circuit 1211 may relatively weaken the degree to which the equalizers 1207 amplifies high-frequency components of the internal CA signals ICA[A:0] or may disable the equalizers 1207. When the location of the memory device 1000 on the bus 130 is relatively distant from the memory controller 11, the calibration logic circuit 1211 may relatively reinforce the degree to which the equalizers 1207 amplify high-frequency components of the internal CA signals ICA[A:0] or may enable the equalizers 1207. The calibration logic circuit 1211 may perform training between the clock signal CK and the CA signals CA[A:0] by using the location information LI. Generally, the expression "training between" refers to adjusting some aspect of the circuit at the memory device based on the memory device position. For example, as used herein, "training between" includes delaying internal signals ICA as described below. The calibration logic circuit 1211 may adjust the degree to which the delay clock signal ICKD used to sample the internal CA signals ICA[A:0] is delayed by the delay circuit 1203, by using the location information LI. The calibration logic circuit 1211 may delay the internal CA signals ICA[A:0] by using the location information LI1. The calibration logic circuit 1211 may further perform training between the internal CA signals ICA[A:0] by using the location information LI1. By differently delaying the internal CA signals ICA[A:0], the calibration logic circuit 1211 may reduce, remove, or compensate for a skew of the internal CA signals ICA[A:0] due to a skew of the pins 1204, and may align the internal CA signals ICA[A:0] to the delay clock signal ICKD.

The voltage generator 1205 may adjust a level of the reference voltage VREFCA by using the location information LI. For example, the voltage generator 1205 may differently adjust a level of the reference voltage VREFCA depending on whether the location information LI indicates that a location of the memory device 1000 on the bus 130 is relatively close to the memory controller 11 or is relatively distant from the memory controller 11.

The memory device 1000 may further include a DQS pin 1301, a DQS buffer 1302, a write leveling circuit 1304, and a DQS signal generator 1305. The DQS pin 1301 may be connected with one path of the DQ bus between the memory controller 11 and one of the memory devices 110 and 120 and may receive or transmit a DQS signal (or data strobe signal). Here, "DQS" may mean a data strobe. The DQS buffer 1302 may include a receiver 1303 and a transmitter 1306. The receiver 1303 may receive the DQS signal, may amplify the received DQS signal, and may generate an internal DQS signal IDQS. The DQS signal received by the receiver 1303 may correspond to a write DQS signal. The receiver 1303 may further receive a complementary DQS signal DQSb through a complementary DQS pin connected with another path of the DQ bus.

The write leveling circuit 1304 may perform training between the clock signal CK and the DQS signal DQS by using the location information LI. As used herein, "training between" includes aligning internal DQS signals to an internal clock as described below. The write leveling circuit 1304 may align the internal DQS signal IDQS to the internal clock signal ICK by adjusting a delay amount of the internal DQS signal IDQS by using the location information LI. The internal DQS signal IDQS that is output by the receiver 1303 and is adjusted by the write leveling circuit 1304 may be used to sample write data included in the DQ signals DQ[B:0].

The DQS signal generator 1305 may generate and output the DQS signal from the internal clock signal ICK under control of the command decoder 1209. The transmitter 1306 may transmit and output the DQS signal generated by the DQS signal generator 1305 to the memory controller 11 through the pin 1301 and the DQ bus. The DQS signal that is generated by the DQS signal generator 1305 and is output by the transmitter 1306 may correspond to a read DQS signal. The DQS signal generator 1305 may include a delay locked loop DLL that fixes or adjusts a delay between the internal clock signal ICK and the DQS signal. The delay locked loop DLL may include one or more delay circuits. The delay locked loop DLL may align the DQS signal to the internal clock signal ICK by delaying the internal clock signal ICK, the DQS signal, or internal signals from one or more internal delay circuits by using the location information LI.

The memory device 1000 may further include a DQ pin 1401, a voltage generator 1402, DQ buffers 1403, equalizers 1405, a deserializer 1406, a serializer 1407, pre-emphasis circuits 1409, and a calibration logic circuit 1410. The DQS pins 1401 may be connected with paths of the DQ bus between the memory controller 11 and one of the memory devices 110 and 120 and may respectively receive or transmit the DQ signals DQ[B:0]. As described above, "DQ" may mean a data input/output. The voltage generator 1402 may generate a reference voltage VREFDQ and may provide the reference voltage VREFDQ to receivers 1404 of the DQ buffers 1403.

The DQ buffers 1403 may respectively include the receivers 1404 and may respectively include transmitters 1408. The receivers 1404 may respectively receive the DQ signals DQ[B:0] through the DQ pins 1401. The receivers 1404 may compare voltage levels of the DQ signals DQ[B:0] with a level of the reference voltage VREFDQ, respectively. For example, the reference voltage VREFDQ may be an internal voltage that is used to determine voltage levels of the DQ signals DQ[B:0] corresponding to logical values and may be identical to or different from the reference voltage VREFCA. The receivers 1404 may respectively amplify the DQ signals DQ[B:0] based on the reference voltage VREFDQ and may provide write DQ signals WDQ[B:0] to the deserializer 1406.

The equalizers 1405 may compensate for and restore high-frequency components of the DQ signals DQ[B:0] input to the receivers 1404 through the DQ bus and the DQ pins 1401, respectively. In the case where the DQ signals DQ[B:0] are transmitted through the DQ bus at high speed, high-frequency components of the DQ signals DQ[B:0] on the receivers 1404 may be weakened due to the limited bandwidth of the DQ bus. For example, an operation of the equalizers 1405 may be similar to the operation of the equalizers 1207.

Under control of the command decoder 1209, the deserializer 1406 may sample logical values of the write DQ signals WDQ[B:0] at an edge of the internal DQS signal IDQS, may parallelize the sampled logical values, may generate write data WDATA, and may output the write data WDATA to the write driver 1104. In FIG. 6, the DQS signal is provided to the deserializer 1406. The serializer 1407 may receive read data RDATA from the input/output sense amplifier 1105 of the bank 1100 under control of the command decoder 1209. The serializer 1407 may serialize the read data RDATA and may generate read DQ signals RDQ[B:0]. The serializer 1407 may align the read DQ signals RDQ[B:0] to the DQS signal generated by the DQS signal generator 1305. In FIG. 6, the DQS signal is provided to the serializer 1407.

The transmitters 1408 may transmit or output the read DQ signals RDQ[B:0] generated by the serializer 1407 to the memory controller 11 through the DQ pins 1401 and the DQ bus as the DQ signals DQ[B:0]. The transmitters 1408 may respectively drive transmission paths of the DQ bus respectively connected with the DQ pins 1401 depending on logical values of the read DQ signals RDQ[B:0]. The pre-emphasis circuits 1409 may respectively perform pre-emphasis operations on the read DQ signals RDQ[B:0] generated by the serializer 1407. Even in the case where the DQ signals DQ[B:0] are transmitted from the transmitters 1408 to the memory controller 11 through the DQ bus at high speed, high-frequency components of the DQ signals DQ[B:0] on the memory controller 11 may be weakened due to the limited bandwidth of the DQ bus. The pre-emphasis circuits 1409 may in advance distort the DQ signals DQ[B:0] by amplifying high-frequency components of the read DQ signals RDQ[B:0], and may compensate for high-frequency components of the DQ signals DQ[B:0] on the memory controller 11. For example, the pre-emphasis circuits 1409 may perform pre-emphasis operations by using two methods: pre-shot and de-emphasis.

The calibration logic circuit 1410 may adjust the equalizers 1405 by using the location information LI, respectively. The calibration logic circuit 1410 may differently adjust the equalizers 1405 depending on whether the location information LI indicates that a location of the memory device 1000 on the bus 130 is relatively close to the memory controller 11 or is relatively distant from the memory controller 11. The calibration logic circuit 1410 may adjust the pre-emphasis circuits 1409, that is, degrees to which the read DQ signals RDQ[B:0] are respectively amplified by the pre-emphasis circuits 1409, by using the location information LI. The calibration logic circuit 1410 may differently adjust the pre-emphasis circuits 1409 depending on whether the location information LI indicates that a location of the memory device 1000 on the bus 130 is relatively close to the memory controller 11 or is relatively distant from the memory controller 11.

The calibration logic circuit 1410 may perform training between the DQ signals DQ[B:0] and the DQS signal DQS by using the location information LI. As used herein, "training between" includes adjusting a delay amount of an internal DQS signal as described below. For example, the calibration logic circuit 1410 may adjust a delay amount of the internal DQS signal IDQS to be provided to the deserializer 1406 by using the location information LI. The memory device 1000 may further include a delay circuit that delays the internal DQS signal IDQS under control of the calibration logic circuit 1410. The calibration logic circuit 1410 may control the deserializer 1406 by using the location information LI, and the deserializer 1406 may align the write DQ signals WDQ[B:0] to the internal DQS signal IDQS under control of the calibration logic circuit 1410. The calibration logic circuit 1410 may control the serializer 1407 by using the location information LI and may align the read DQ signals RDQ[B:0] to the DQS signals generated by the DQS signal generator 1305 under control of the calibration logic circuit 1410. The calibration logic circuit 1410 may further perform training between the write DQ signals WDQ[B:0] by using the location information LI. As used herein, "training between" includes compensating for a skew of write DQ signals as described below. The calibration logic circuit 1410 may reduce, remove, or compensate for a skew of the write DQ signals WDQ[B:0] due to a skew of the pins 1401 by differently delaying the write DQ signals WDQ[B:0], and may align the write DQ signals WDQ[B:0] to the internal DQS signal IDQS. The calibration logic circuit 1410 may perform training between the read DQ signals RDQ[B:0] by using the location information LI. As used herein, "training between" includes compensating for a skew of write DQS signals as described below. The calibration logic circuit 1410 may reduce, remove, or compensate for a skew of the DQS signals DQS[B:0] due to a skew of the pins 1401 by differently delaying the read DQS signals RDQS[B:0].

The voltage generator 1402 may adjust a level of the reference voltage VREFDQ by using the location information LI. For example, the voltage generator 1402 may differently adjust a level of the reference voltage VREFDQ depending on whether the location information LI indicates that a location of the memory device 1000 on the bus 130 is relatively close to the memory controller 11 or is relatively distant from the memory controller 11.

The memory device 1000 may further include a pin 1501, a ZQ calibration logic circuit 1502, and ODT circuits 1503 to 1505. The pin 1501 may be connected with an external resistor RZQ placed outside the memory device 1000. The external resistor RZQ may be a passive element that has no influence of the PVT (process, voltage, temperature) variation of the memory device 1000. For example, the external resistor RZQ may have a resistance value of 240Ω, and a tolerance of +/−1% may be allowable with respect to the external resistor RZQ. The ZQ calibration logic circuit 1502 may generate and output a code ZQCODE by performing a calibration operation based on the external resistor RZQ.

The ODT circuits 1503 may respectively provide ODT resistance values to the DQ pins 1401 based on the code ZQCODE. The ODT circuit 1504 may provide an ODT resistance value to the DQ pin 1301 based on the code ZQCODE. The ODT circuits 1505 may respectively provide ODT resistance values to the CA pins 1204 based on the code ZQCODE. For example, each of the ODT resistance values provided to the DQ pins 1401, the DQS pin 1301, and the CA pins 1204 may be, for example, RZQ/n (e.g., 240Ω, 120Ω, 80Ω, 60Ω, 48Ω, 40Ω, or 34Ω) (n being a natural number). The ODT resistance values provided to the DQ pins 1401, the DQS pin 1301, and the CA pins 1204 may be identical or different. Here, "n" may be variously decided depending on data stored in the mode registers 1210 by the mode register write command MRW from the memory controller 11.

The memory device 1000 may further include a temperature sensor 1701 and a refresh controller 1702. The temperature sensor 1701 may sense a temperature of the memory device 1000 under control of the refresh controller 1702 and may provide temperature information to the refresh controller 1702. The refresh controller 1702 may adjust an update period of the temperature sensor 1701 (i.e., a period in which the temperature sensor 1701 senses a temperature) by using the location information LI. The refresh controller 1702 may adjust a refresh period associated with the memory cell array 1101 based on the temperature information. The refresh controller 1702 may include a counter circuit that generates row addresses indicating word lines connected with memory cells to be refreshed, under control of the command decoder 1209. The fuse array 1800 may include a plurality of anti-fuses. The fuse array 1800 may include an anti-fuse in which a logical value of the location information LI (③) is programmed. The anti-fuse may be ruptured by an electrical signal. The anti-fuse may change from a high-resistance state to a low-resistance state by an electrical signal. The anti-fuse may be a nonvolatile and may be a one-time programmable (OTP) memory.

A voltage generator 1900 may generate various internal voltages IV to be provided to the bank 1100 by using a power supply voltage of the memory device 1000. For example, the internal voltages IV may include a word line enable voltage, a word line disable voltage, a column selection line enable voltage, a precharge voltage, etc. The voltage generator 1900 may adjust at least one or more of levels of the internal voltages IV by using the location information LI. For example, the location information LI provided to the voltage generator 1900 may be identical to the location information LI provided to the voltage generators 1205 and 1402 and the calibration logic circuits 1211 and 1410. In this case, the location information LI may indicate a distance of a power path through which the memory device 1000 is supplied with power supply voltages from a power management integrated circuit (PMIC) (refer to 1310 of FIG. 13) to be described later, as well as a distance of the bus 130 between the memory device 1000 and the memory controller 11. As a distance between the memory device 1000 and the PMIC increases, the power integrity (PI) of operating voltages supplied to the memory device 1000 may be degraded. The voltage generators 1205 and 1402 described above may be included in the voltage generator 1900. For another example, the location information LI provided to the voltage generator 1900 may be different from the location information LI provided to the voltage generators 1205 and 1402 and the calibration logic circuits 1211 and 1410. The location information LI provided to the voltage generators 1205 and 1402 and the calibration logic circuits 1211 and 1410 may indicate a distance of the bus 130 between memory device 1000 and the memory controller 11. The location information LI provided to the voltage generator 1900 may indicate a distance between the memory device 1000 and the PMIC. The location information LI may be provided to the voltage generator 1900 through the pin 1600 or any other pin, or the location information LI may be provided from the fuse array 1800 to the voltage generator 1900. In any case, the location information LI1 may indicate a distance of the bus 130 between the memory device 1000 and the memory controller 11 or a distance between the memory device 1000 and the PMIC.

Figure 7:
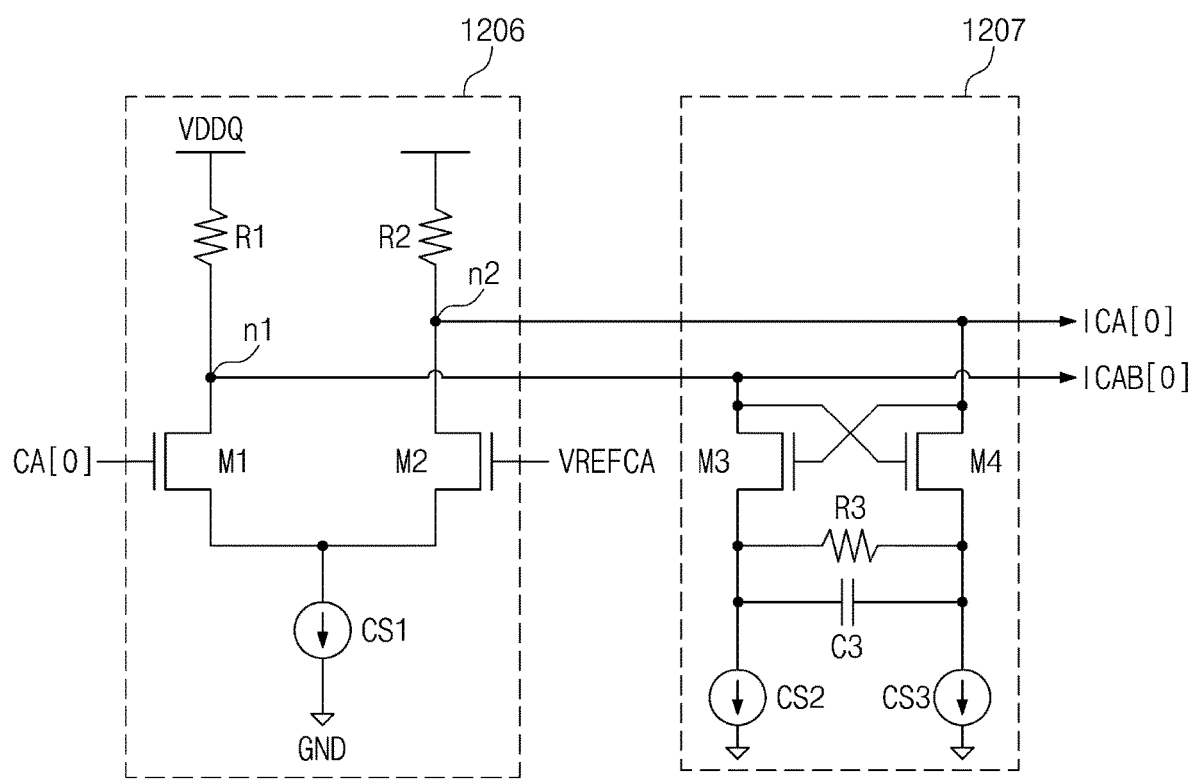
FIG. 7 illustrates a receiver and an equalizer of a memory device of FIG. 6 in detail.

FIG. 7 illustrates a receiver and an equalizer of a memory device of FIG. 6 in detail. The receiver 1206 may be an example of the receiver 1206 of FIG. 6 receiving the CA signal CA[0]. The receiver 1206 may include transistors M1 and M2, resistors R1 and R2, a current source CS1. The receiver 1206 may compare the CA signal CA[0] and the reference voltage VREFCA, may amplify a voltage difference between the CA signal CA[0] and the reference voltage VREFCA, and may generate the internal CA signals ICA[0] and ICAB[0] at nodes n1 and n2. The transistor M1 may receive the CA signal CA[0] through a gate terminal. A source terminal of the transistor M1 may be connected with the current source CS1, and a drain terminal of the transistor M1 may be connected with the node n1 and the resistor R1. The transistor M2 may receive the reference voltage VREFCA through a gate terminal. A source terminal of the transistor M2 may be connected with the current source CS1, and a drain terminal of the transistor M2 may be connected with the node n2 and the resistor R2. The current source CS1 may generate a bias current flowing through the transistors M1 and M2. A gain of the receiver 1206 may vary depending on the magnitude of the bias current. The receiver 1206 may be also referred to as a "variable gain amplifier (VGA)". For example, the calibration logic circuit 1211 may adjust a gain of the receiver 1206 by adjusting the magnitude of the bias current depending on the location information LI. The current source CS1 may be implemented with a transistor that has a gate terminal configured to receive a bias voltage, a drain terminal connected with the transistors M1 and M2, and a source terminal connected with a ground voltage GND. The resistor R1 may be connected between a power supply voltage VDDQ and the drain terminal of the transistor M1. The resistor R2 may be connected between the power supply voltage VDDQ and the drain terminal of the transistor M2. Each of the resistors R1 and R2 may be implemented with a passive element or a transistor. For example, the remaining receivers 1206, 1303, and 1404 of FIG. 6 may be implemented to be substantially identical to the receiver 1206 except that different signals are input to the gate terminals of the transistors M1 and M2.

The equalizer 1207 may be an example of the equalizer 1207 of FIG. 6 connected with the receiver 1206 receiving the CA signal CA[0]. The equalizer 1207 may include transistors M3 and M4, a resistor R3, a capacitor C3, and current sources CS2 and CS3. A drain terminal of the transistor M3 and a gate terminal of the transistor M4 may be connected with the node n1. A gate terminal of the transistor M3 and a drain terminal of the transistor M4 may be connected with the node n2. A source terminal of the transistor M3 may be connected with the current source CS2, a first end of the resistor R3, and a first end of the capacitor C3. A source terminal of the transistor M4 may be connected with the current source CS3, a second end of the resistor R3, and a second end of the capacitor C3. The transistors M3 and M4 may form a cross-coupled pair. The current source CS2 may generate a bias current flowing through the transistor M3. The current source CS3 may generate a bias current flowing through the transistor M4. Each of the current sources CS2 and CS3 may be implemented with a transistor that has a gate terminal configured to receive a bias voltage, a drain terminal connected with the corresponding one of the transistors M3 and M4, and a source terminal connected with the ground voltage GND. The equalizer 1207 may be a high pass filter that boosts a high-frequency component of the internal CA signals ICA[0] and ICAB[0]. The transistors M3 and M4 may amplify the internal CA signals ICA[0] and ICAB[0] in a positive feedback manner. The equalizer 1207 may provide a negative impedance or a negative capacitance to the nodes n1 and n2. The equalizer 1207 may be a negative capacitance equalizer (NCE) or a continuous time linear equalizer (CTLE). The calibration logic circuit 1211 may adjust the degree to which the equalizer 1207 amplifies the internal CA signals ICA[0] and ICAB[0], that is, the strength (or intensity) of the equalizer 1207 by adjusting magnitudes of the bias currents of the current sources CS2 and CS3 depending on the location information LI. The remaining equalizers 1207 of FIG. 6 associated with the internal CA signals CA[A:1] may be implemented to be substantially identical to the equalizer 1207. Transistors of FIG. 7 may be implemented by using an n-channel metal oxide semiconductor field effect transistor (NMOS transistor), a p-channel metal oxide semiconductor field effect transistor (PMOS transistor), or a combination of an NMOS transistor and a PMOS transistor.

Figure 8:
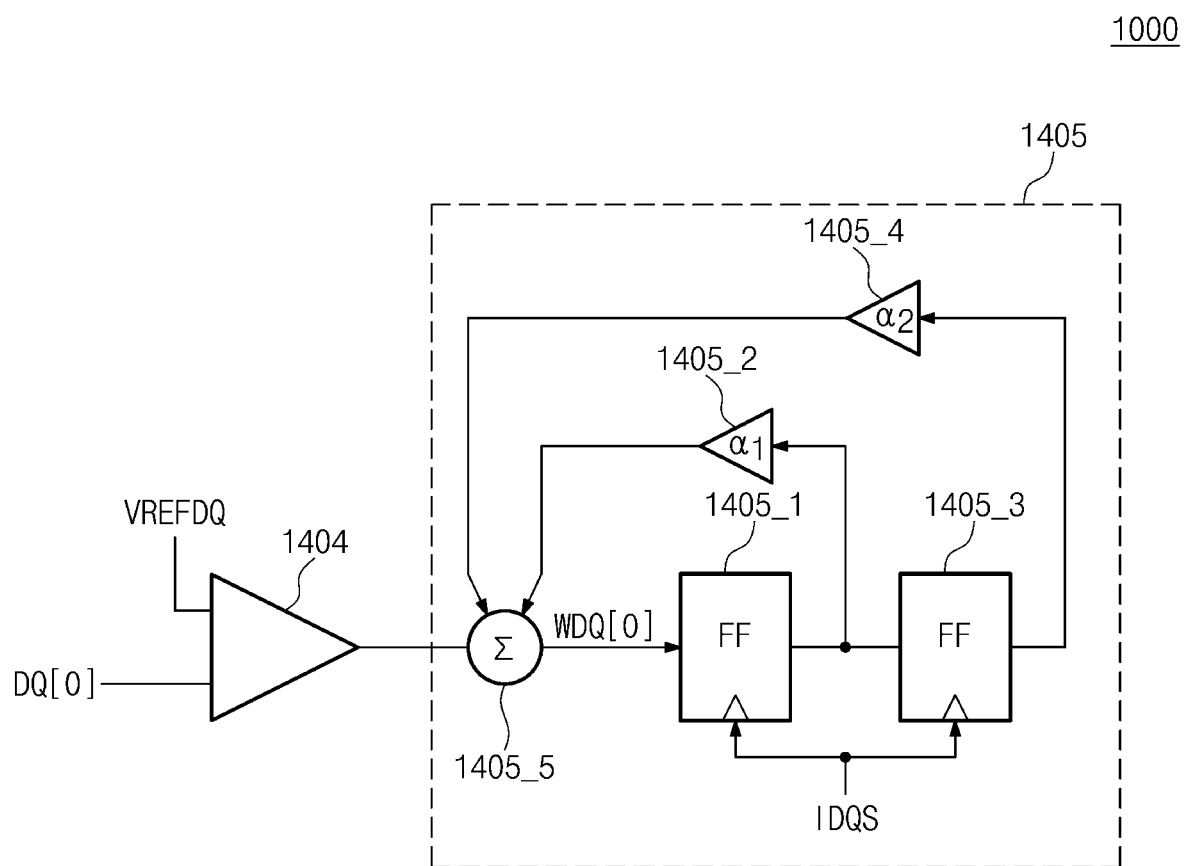
FIG. 8 illustrates a receiver and an equalizer of a memory device of FIG. 6 in detail.

FIG. 8 illustrates a receiver and an equalizer of a memory device of FIG. 6 in detail. The receiver 1404 may be an example of the receiver 1404 of FIG. 6 receiving the DQ signal DQ[0]. The receiver 1404 may be implemented to be substantially identical to the receiver 1206 of FIG. 7 except that the DQ signal DQ[0] and the reference voltage VREFDQ are respectively input to the gate terminals of the transistors M1 and M2. The receivers 1404 receiving the remaining DQ signals DQ[B:1] may be implemented to be substantially identical to the receiver 1206. The calibration logic circuit 1410 may adjust a gain of the receiver 1404 by adjusting the magnitude of the bias current depending on the location information LI1.

The equalizer 1405 may be an example of the equalizer 1405 of FIG. 6 connected with the receiver 1404 receiving the DQ signal DQ[0]. For example, the equalizer 1405 may be a decision feedback equalizer (DFE). The equalizer 1405 may include flip-flops 1405_1 and 1405_3, multipliers 1405_2 and 1405_4, and an adder 1405_5. The flip-flop 1405_1 and the multiplier 1405_2 may constitute a tap, and the flip-flop 1405_3 and the multiplier 1405_4 may constitute another tap. The flip-flop 1405_1 may sample a logical value of the write DQ signal WDQ[0] at an edge of the internal DQS signal IDQS, and the flip-flop 1405_3 may sample an output value of the flip-flop 1405_1 at the edge of the internal DQS signal IDQS. The multiplier 1405_2 may multiply the output value of the flip-flop 1405_1 and an attenuation coefficient $\alpha_1$ together. The multiplier 1405_4 may multiply the output value of the flip-flop 1405_3 and an attenuation coefficient $\alpha_2$ together. The adder 1405_5 may add an output of the receiver 1404 and outputs of the multipliers 1405_2 and 1405_4 and may generate the write DQ signal WDQ[0]. The equalizer 1405 may reduce the ISI of the write DQ signal WDQ[0] currently sampled by the receiver 1404 by using the DQ signal(s) DQ[0] previously sampled by the receiver 1404.

The number of taps and the values of the attenuation coefficients may be updated based on training or calibration.

Depending on the location information LI, the calibration logic circuit 1410 may adjust the number of taps of the equalizer 1405 or may adjust the attenuation coefficients $\alpha_1$ and $\alpha_2$. The remaining equalizers 1405 of FIG. 6 associated with the write DQ signals WDQ[B:1] may be implemented to be substantially identical to the equalizer 1405.

The equalizer 1207 of FIG. 7 is described as an example of the equalizers 1207 of FIG. 6 associated with the CA signals CA[A:0] but may be an example of the equalizers 1405 of FIG. 6 associated with the DQ signals DQ[B:0]. Also, the equalizer 1405 of FIG. 8 is described as an example of the equalizers 1405 of FIG. 6 associated with the DQ signals DQ[B:0] but may be an example of the equalizers 1207 of FIG. 6 associated with the CA signals CA[A:0].

Figure 9:
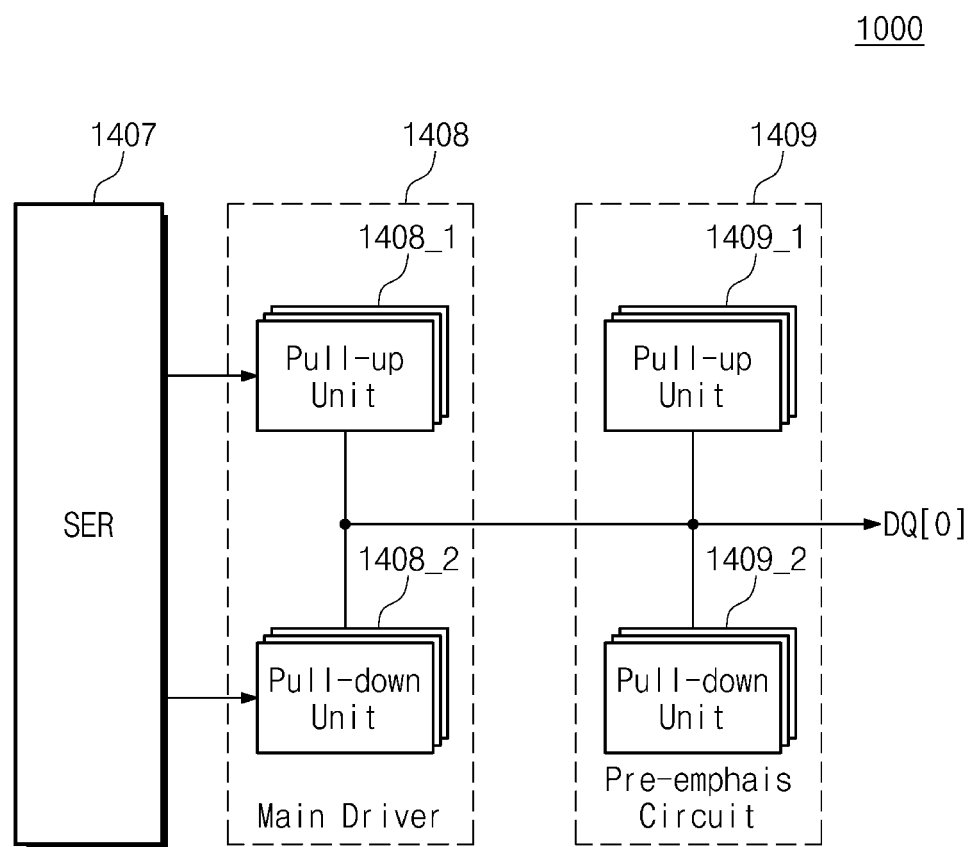
FIG. 9 illustrates a serializer and a transmitter of a memory device of FIG. 6 in detail.

FIG. 9 illustrates a serializer and a transmitter of a memory device of FIG. 6 in detail. The transmitter 1408 may be an example of the transmitter 1408 of FIG. 6 receiving the read DQ signal RDQ[0]. The transmitter 1408 may be referred to as a "main driver" and may include pull-up units 1408_1 and pull-down units 1408_2. The pull-up units 1408_1 may drive the DQ signal DQ[0] with a voltage level corresponding to the second logical value (e.g., high) depending on read data serialized by the serializer 1407. The pull-down units 1408_2 may drive the DQ signal DQ[0] with a voltage level corresponding to the first logical value (e.g., low) depending on the read data serialized by the serializer 1407. Depending on the location information LI, the calibration logic circuit 1410 may adjust the number of pull-up units 1408_1 or the number of pull-down units 1408_2. The calibration logic circuit 1410 may adjust a driving capability of each of the pull-up units 1408_1 or a driving capability of each of the pull-down units 1408_2. The remaining transmitters 1408 of FIG. 6 associated with the read DQ signals RDQ[B:1] may be implemented to be substantially identical to the transmitter 1408.

The pre-emphasis circuit 1409 may be an example of the pre-emphasis circuit 1409 of FIG. 6 connected with the transmitter 1408 receiving the read DQ signal RDQ[0]. The pre-emphasis circuit 1409 may include pull-up units 1409_1 and pull-down units 1409_2. As a logical value of the read data serialized by the serializer 1407 is changed, the pull-up units 1409_1 may drive the DQ signal DQ[0] with a voltage level corresponding to the second logical value, and the pull-down units 1409_2 may drive the DQ signal DQ[0] with a voltage level corresponding to the first logical value. Depending on the location information LI, the calibration logic circuit 1410 may adjust the number of pull-up units 1409_1 or the number of pull-down units 1409_2. The calibration logic circuit 1410 may adjust a driving capability of each of the pull-up units 1409_1 or a driving capability of each of the pull-down units 1409_2. For example, the remaining transmitters 1408 of FIG. 6 associated with the read DQ signals RDQ[B:1] may be implemented to be substantially identical to the transmitter 1408 of FIG. 9. The remaining pre-emphasis circuits 1409 of FIG. 6 associated with the read DQ signals RDQ[B:1] may be implemented to be substantially identical to the pre-emphasis circuit 1409.

Figure 10:
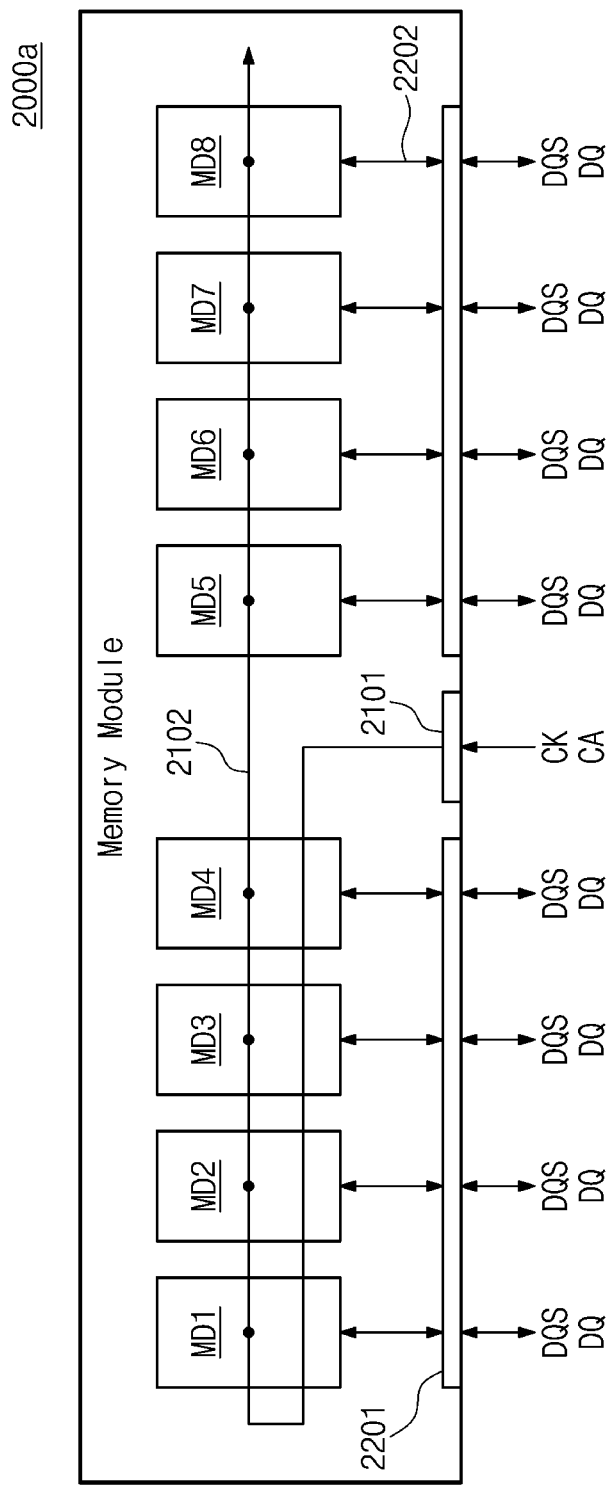
FIGS. 10, 11, and 12 illustrate block diagrams of memory modules according to example embodiments.
Figure 11:
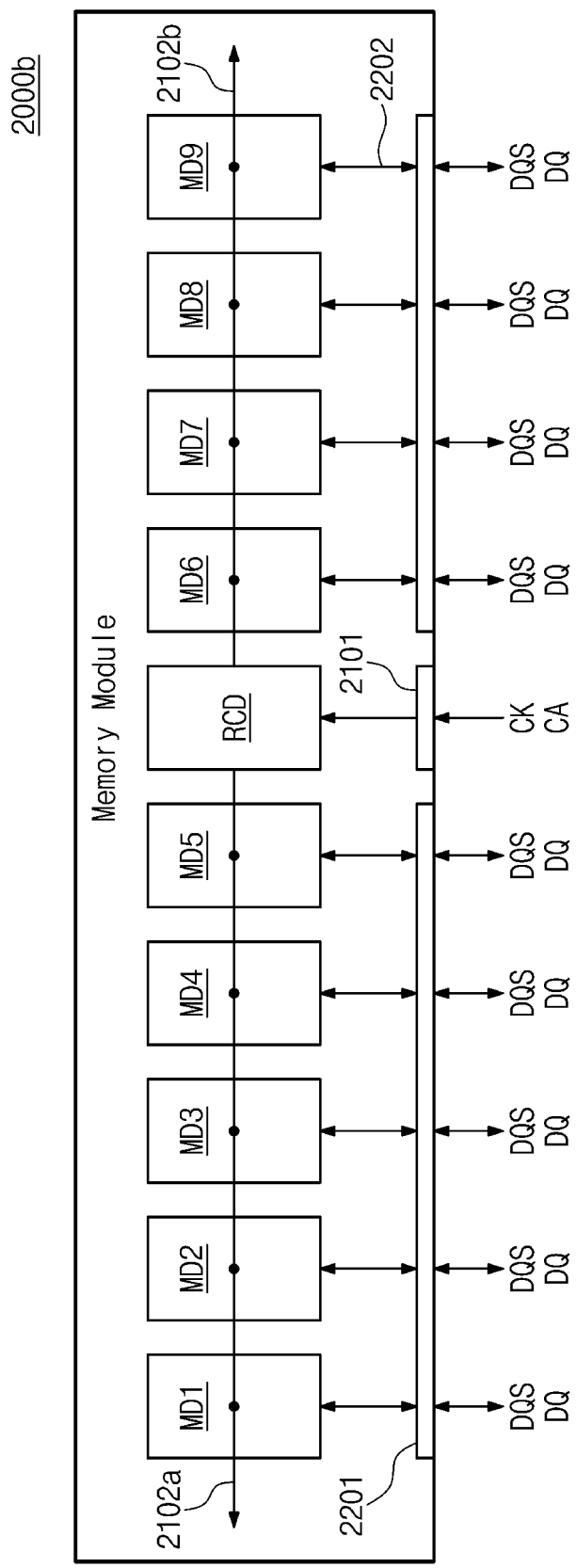
Figure 12:
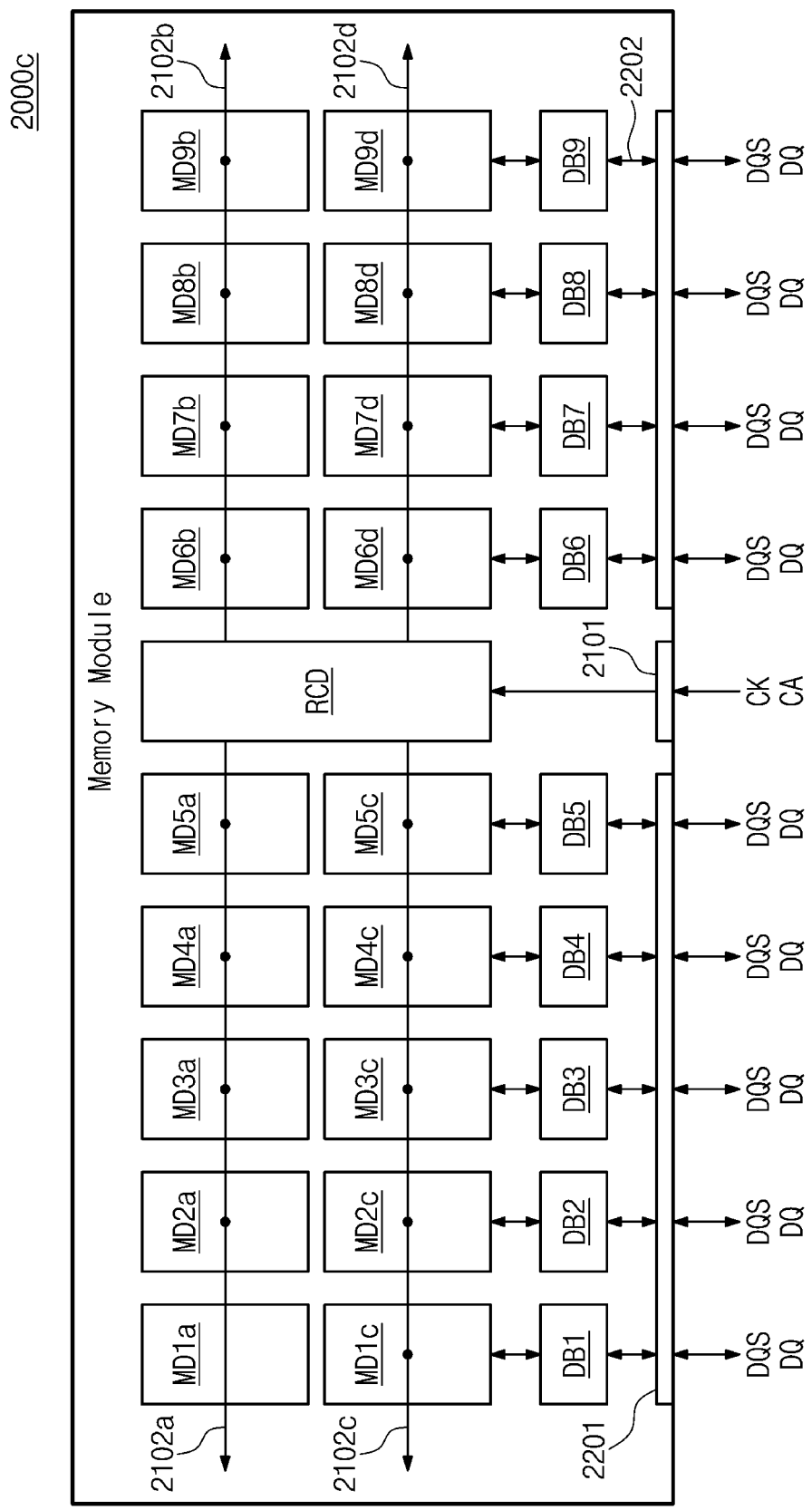

FIGS. 10, 11 and 12 illustrate block diagrams of memory modules according to example embodiments. Memory modules 2000a to 2000c may be a dual in-line memory module (DIMM) that complies with the JEDEC (Joint Electron Device Engineering Council) standard. For example, the memory module 2000a may be an unbuffered DIMM (UDIMM), the memory module 2000b may be a registered DIMM (RDIMM), and the memory module 2000c may be a load reduced DIMM (LRDIMM). A memory module according to an example embodiment may be implemented with a fully buffered DIMM (FB-DIMM), a small outline DIMM (SO-DIMM), or any other memory module (e.g., a single in-line memory module (SIMM)), as well as the above examples.

The memory module 2000a may include pins 2101 and 2201, a CA bus 2102, DQ buses 2202, and memory devices MD1 to MD8. Each of the memory devices MD1 to MD8 may be substantially identical to the memory device 1000 of FIG. 6

The pins 2101 may include a clock pin and a CA pin receiving the clock signal CK and the CA signals CA from the memory controller 11, respectively. The CA bus 2102 may include transmission paths physically and electrically connecting the pins 2101 of the memory module 2000a with the pins 1201 and 1204 of each of the memory devices MD1 to MD8. The CA bus 2102 may correspond to the bus 130. For example, the location information LI described with reference to FIG. 6 may indicate a location of each of the memory devices MD1 to MD8 on the CA bus 2102 with respect to the pins 2101. The pins 2201 may include DQ pins and DQS pins receiving (write) DQ signals DQ and (write) DQS signals DQS from the memory controller 11 or (read) DQ signals DQ and (read) DQS signals DQS from the memory devices MD1 to MD8. The DQ bus 2202 may include transmission paths physically and electrically connecting the pins 2201 of the memory module 2000a with the pins 1401 and 1301 of the memory devices MD1 to MD8. As described above, the CA bus 2102 may be shared by the memory devices MD1 to MD8, but the DQ buses 2202 may be provided to respectively correspond to memory devices MD1 to MD8 and may not be shared by the memory devices MD1 to MD8.

The memory module 2000b may further include a register clock driver RCD and a memory device MD9 compared with the memory module 2000a. A CA bus 2102a may include transmission paths physically and electrically connecting the register clock driver RCD with the pins 1201 and 1204 of each of the memory devices MD1 to MD5. A CA bus 2102b may include transmission paths physically and electrically connecting the register clock driver RCD with the pins 1201 and 1204 of each of the memory devices MD6 to MD9. The register clock driver RCD may receive the clock signal CK and CA signals CA through the pins 2101. The register clock driver RCD may transmit the received clock signal CK and the received CA signals CA to the memory devices MD1 to MD5 through the CA bus 2102a and to the memory devices MD6 to MD9 through the CA bus 2102b. The register clock driver RCD may buffer the clock signal CK and the CA signals CA. The location information LI described with reference to FIG. 6 may indicate a location of each of the memory devices MD1 to MD5 on the CA bus 2102a with respect to the register clock driver RCD or may indicate a location of each of the memory devices MD6 to MD9 on the CA bus 2102b with respect to the register clock driver RCD.

The memory module 2000c may further include memory devices MD1a to MD5a, MD1c to MD5c, MD6b to MD9b, and MD6d to MD9d and data buffers DB1 to DB9 compared with the memory module 2000b. The CA bus 2102a may include transmission paths physically and electrically connecting the register clock driver RCD with the pins 1201 and 1204 of each of the memory devices MD1a to MD5a. The CA bus 2102b may include transmission paths physically and electrically connecting the register clock driver RCD with the pins 1201 and 1204 of each of the memory devices MD6b to MD9b. A CA bus 2102c may include transmission paths physically and electrically connecting the register clock driver RCD with the pins 1201 and 1204 of each of the memory devices MD1c to MD5c. A CA bus 2102d may include transmission paths physically and electrically connecting the register clock driver RCD with the pins 1201 and 1204 of each of the memory devices MD6d to MD9d. The register clock driver RCD may receive the clock signal CK and the CA signals CA through the pins 2101. The register clock driver RCD may transmit the received clock signal CK and the received CA signals CA to the memory devices MD1a to MD5a through the CA bus 2102a, to the memory devices MD6b to MD9b through the CA bus 2102b, to the memory devices MD1c to MD5c through the CA bus 2102c, and to the memory devices MD6d to MD9d through the CA bus 2102d. The location information LI described with reference to FIG. 6 may indicate a location of each of the memory devices MD1a to MD5a on the CA bus 2102a, a location of each of the memory devices MD6b to MD9b on the CA bus 2102b, a location of each of the memory devices MD1c to MD5c on the CA bus 2102c, or a location of each of the memory devices MD6d to MD9d on the CA bus 2102d with respect to the register clock driver RCD. The data buffers DB1 may be disposed on the DQ buss 2202 between the memory devices MD1a and MD1c and the memory controller 11. The data buffer DB1 may be physically and electrically connected with the pins 1301 and 1401 of each of the memory devices MD1a and MD1c and may be physically and electrically connected with the pins 2201. The data buffer DB1 may buffer the DQ signals DQ and the DQS signals DQS associated with the memory device MD1a and MD1c. The data buffer DB1 may transmit the buffered DQ signals DQ and the buffered DQS signals DQS to the memory devices MD1a and MD1c or the memory controller 11. The remaining data buffers DB2 to DB9 may be implemented to be similar to the data buffer DB1. In an example embodiment, one surfaces of the memory modules 2000a to 2000c are illustrated in FIGS. 10 to 12 as an example, but memory devices, data buffers, etc. may be mounted on the opposite surfaces of the memory modules 2000a to 2000c. For example, memory devices mounted on one surface of each of the memory modules 2000a to 2000c may constitute a rank. Also, the number of memory devices included in each of the memory modules 2000a to 2000c is not limited to the examples illustrated in FIGS. 10 to 12.

Figure 13:
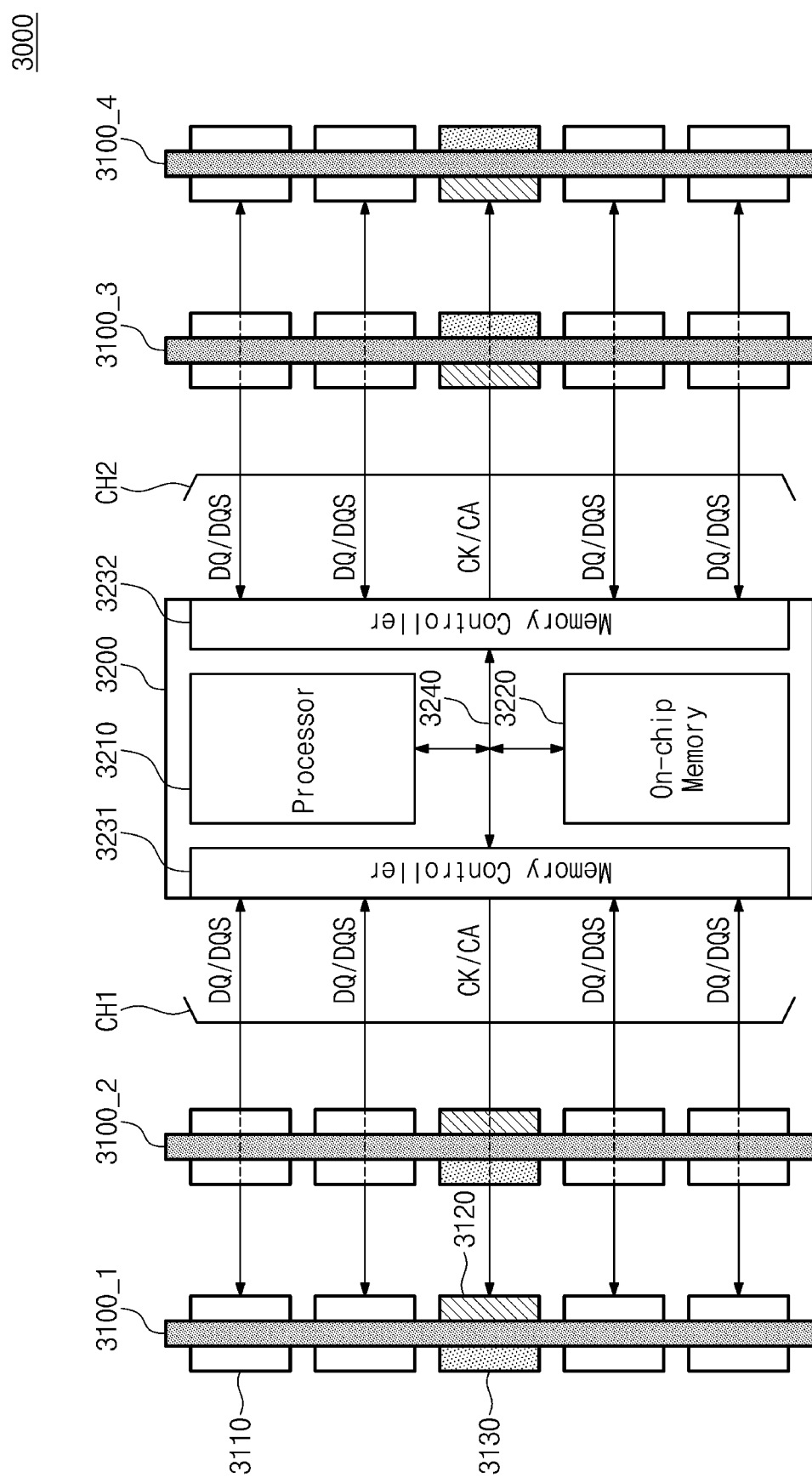
FIGS. 13 and 14 illustrate block diagrams of computing systems according to example embodiments.

FIG. 13 illustrates a block diagram of a computing system according to an example embodiment. A computing system 3000 may correspond to the computing system 10 described above and may include memory modules 3100_1 to 3100_4 and a host 3200. The memory modules 3100_1 to 3100_4 may correspond to the memory module 100/2000a/2000b/2000c. The memory module 3100_1 may include a plurality of memory devices 3110, an RCD 3120, and a PMIC 3130. Each of the memory devices 3110 may be substantially identical to the memory device 1000 of FIG. 6. The RCD 3120 may be substantially identical to the register clock driver RCD described with reference to FIGS. 11 and 12, may receive a CK signal and a CA signal transmitted from the host 3200, and may transmit the received CK signal and the received CA signal to the plurality of memory devices 3110. The PMIC 3130 may supply power supply voltages to internal components 3110 and 3120 in the memory module 3100_1. Each of the memory modules 3100_2 to 3100_4 may be substantially identical to the memory module 3100_1. The memory modules 3100_1 and 3100_2 may be allocated to a channel CH1. The memory modules 3100_3 and 3100_4 may be allocated to a channel CH2. The channel CH1 may include input/output paths for the memory modules 3100_1 and 3100_2, and the channel CH2 may include input/output paths for the memory modules 3100_3 and 3100_4. The number of channels CH1 and CH2, the number of memory devices 3110, the number of memory modules 3100_1 to 3100_4, and the number of memory modules per channel are exemplary. The host 3200 may be an application processor (AP) or a system-on-chip (SoC). The host 3200 may include a system bus 3240 connecting a processor 3210, an on-chip memory 3220, and memory controllers 3231 and 3232. The processor 3210 may execute various software (e.g., an application program, an operating system, a file system, and a device driver) loaded onto the on-chip memory 3220. The processor 3210 may include a homogeneous multi-core or a heterogeneous multi-core. For example, the processor 3210 may include at least one of a central processing unit (CPU), an image signal processing unit (ISP), a digital signal processing unit (DSP), a graphics processing unit (GPU), a vision processing unit (VPU), and a neural processing unit (NPU). An application program, an operating system, a file system, a device driver, etc. for driving the computing system 3000 may be loaded onto the on-chip memory 3220. The on-chip memory 3220 may be an SRAM or a register that is implemented within the host 3200 and has a faster data input/output speed than the memory modules 3100_1 to 3100_4. The on-chip memory 3220 may be referred to as a "buffer memory". The memory controllers 3231 and 3232 may correspond to the memory controller 11 described above. The memory controller 3231 may access the memory modules 3100_1 and 3100_2 through the channel CH1 under control of the processor 3210. The memory controller 3232 may access the memory modules 3100_3 and 3100_4 through the channel CH2 under control of the processor 3210.

Figure 14:
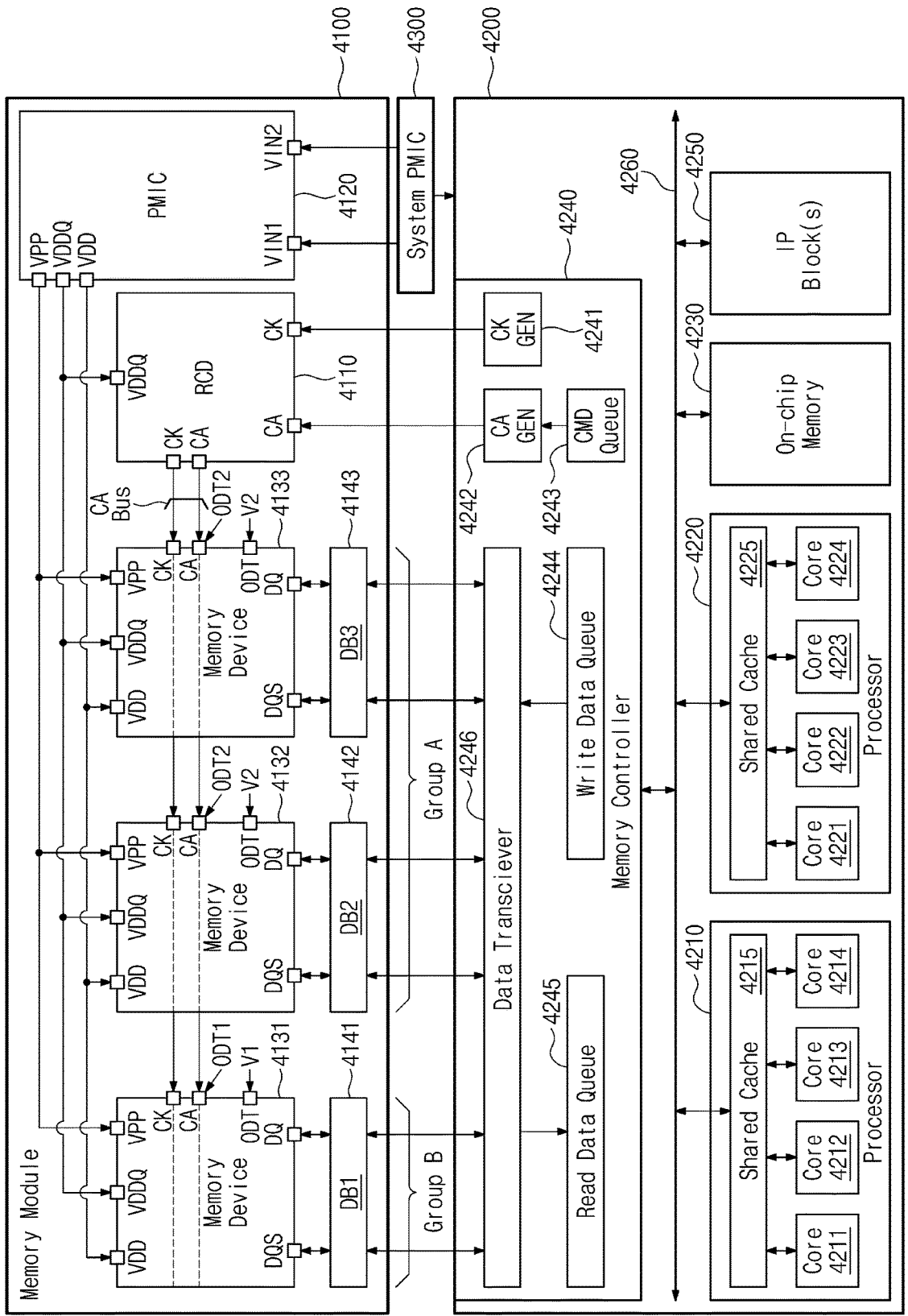

FIG. 14 illustrates a block diagram of a computing system according to an example embodiment. A computing system 4000 may correspond to the computing system 10/3000 described above and may include a memory module 4100, a host 4200, and a system PMIC 4300. The memory module 4100 may include an RCD 4110, an PMIC 4120, and memory devices 4131 to 4133. The RCD 4110 may correspond to the register clock driver RCD described with reference to FIGS. 11 and 12 and the RCD 3120 described with reference to FIG. 13. The RCD 4110 may include a CK input pin and a CA input pin respectively receiving the CK signal CK and the CA signal CA transmitted from a memory controller 4240 through a channel (refer to CH1 and CH2 of FIG. 13). The RCD 4110 may include a CK output pin and a CA output pin outputting the CA signal and the CK signal to the memory devices 4131 to 4133. The RCD 4110 may include a VDDQ pin that is supplied with the power supply voltage VDDQ from the PMIC 4120. The PMIC 4120 may include a VIN1 pin and a VIN2 pin that are supplied with input voltages VIN1 and VIN2 from the system PMIC 4300. The PMIC 4120 may generate the power supply voltages VDD, VDDQ, and VPP by using the power supply voltages VIN1 and VIN2, may supply the power supply voltages VDD, VDDQ, and VPP to the memory devices 4131 to 4133, and may supply the power supply voltage VDDQ to the RCD 4110. The memory devices 4131 to 4133 and the RCD 4110 may correspond to a load device of the PMIC 4120. For example, the input voltage VIN1 may be 12 V, the input voltage VIN2 may be 3.3 V, the power supply voltage VDD may be 1.1 V, the power supply voltage VDDQ may be 1.1 V, and the power supply voltage VPP may be 1.8 V, and embodiments are not limited to the above numerical values. For example, the power supply voltage VDDQ may be supplied to the components 1205, 1206, 1207, 1505, 1202, 1302, 1304, 1305, 1504, 1402, 1403, 1405, 1409, 1503, and 1502 of the pins 1201, 1204, 1301, 1401, and 1501 of the memory device 1000, the power supply voltage VDD may be supplied to the remaining components of the memory device 1000, and the power supply voltage VPP may be used to generate a word line enable voltage of the memory cell array 1101. Each of the memory devices 4131 to 4133 may be substantially identical to the memory device 1000 of FIG. 6. A CK pin and a CA pin of each of the memory devices 4131 to 4133 may correspond the pins 1201 and 1204 of FIG. 6. The CK pin and the CA pin of each of the memory devices 4131 to 4133 and a CK output pin and a CA output pin of the RCD 4110 may be physically and electrically connected with each other, and this connection may form the CA bus. A DQ pin and a DQS pin of each of the memory devices 4131 to 4133 may correspond to the pins 1401 and 1301 of FIG. 6. Each of the memory devices 4131 to 4133 may include a VDD pin, a VDDQ pin, and a VPP pin that are supplied with the power supply voltages VDD, VDDQ, and VPP from the PMIC 4120. Data buffers 4141 to 4143 may be implemented to be substantially identical to the data buffers DB1 to DB9 of FIG. 12. In an example embodiment, each of the memory devices 4131 to 4133 may include an ODT pin. The ODT pin may correspond to the pin 1600 of FIG. 6. A location of the memory device 4131 on the CA bus may be more distant from the RCD 4110 or the PMIC 4120 than the memory devices 4132 and 4133. A V1 voltage (e.g., a power supply voltage or a ground voltage) may be applied to the ODT pin of the memory device 4131. In contrast, locations of the memory devices 4132 and 4133 on the CA bus may be closer to the RCD 4110 or the PMIC 4120 than the memory device 4131. A V2 voltage (e.g., a ground voltage or a power supply voltage) different from the V1 voltage may be applied to the ODT pin of the memory devices 4132 and 4133. An example is illustrated in FIG. 14 as the RCD 4110 and the PMIC 4120 are adjacent to each other, but embodiments are not limited thereto. For example, the RCD 4110 and the PMIC 4120 may not be adjacent to each other. In any case, a voltage to be applied to the ODT pin of each of the 4131 to 4133 may be decided based on a signal transmission distance from the RCD 4110 to each memory device 4131/4132/4133, may be decided based on a power supply distance from the PMIC 4120 to each memory device 4131/4132/4133, or may be decided based on a distance from the RCD 4110 or the PMIC 4120 to each memory device 4131/4132/4133. The memory device 4131 may use the VI voltage input to the ODT pin as the location information LI described with reference to FIG. 6, or the memory devices 4132 and 4133 may use the V2 voltage input to the ODT pin as the location information LI described with reference to FIG. 6. The host 4200 may correspond to the host 3200 described above. The host 4200 may include processors 4210 and 4220, an on-chip memory 4230, the memory controller 4240, intellectual property (IP) blocks 4250, and a system bus 4260. Each of the processors 4210 and 4220 may correspond to the processor 3210 of FIG. 13. The processor 4210 may include cores 4211 to 4214 and a shared cache 4215. Each of the cores 4211 to 4214 may fetch and decode an instruction, may perform various operations based on the instruction, and may write or read data in or from the data storage spaces 4215, 4230, and 4100. The shared cache 4215 may be shared by the cores 4211 to 4214 and may interconnect the cores 4211 to 4214. The processor 4220 may include cores 4221 to 4224 and a shared cache 4225, and an operation of the processor 4220 may be similar to the operation of the processor 4210. The on-chip memory 4230 may correspond to the on-chip memory 3220 of FIG. 13. The memory controller 4240 may correspond to the memory controllers 3231 and 3232. The memory controller 4240 may include a clock generator 4241, a command and address generator 4242, a command queue 4243, a write data queue 4244, a read data queue 4245, and a data transceiver 4246. The clock generator 4241 may generate the clock signal CK and may transmit the clock signal CK to the memory module 4100. The command and address generator 4242 may receive a command or an address from the command queue 4243 and may transmit the CA signal including the command or the address to the memory module 4100. The command queue 4243 may store commands and addresses generated by the processors 4210 and 4220. The write data queue 4244 may receive and store write data to be stored in the memory module 4100 from the shared caches 4215 and 4225 or the on-chip memory 4230. The read data queue 4245 may store the read data transmitted from the memory module 4100 by a read command of the memory controller 4240. The read data queue 4245 may transmit read data to the shared caches 4215 and 4225 or the on-chip memory 4230. The data transceiver 4246 may transmit the write data of the write data queue 4244 to the memory module 4100. The data transceiver 4246 may receive the read data from the memory module 4100 and may store the read data in the read data queue 4245. The IP blocks 4250 may include, for example, various circuits such as a multimedia controller, a display controller, a temperature sensor, an input/output device, and a clock management circuit. The system bus 4260 may interconnect the above components 4210 to 4250 in the host 4200. In an example embodiment, the memory controller 4240 may issue the mode register read command MRR and may read CA ODT strap values stored in the mode registers 1210 (refer to FIG. 6) of the memory devices 4131 to 4133. Because the V1 voltage, the V2 voltage, and the V2 voltage are respectively applied to the ODT pins of the memory devices 4131 to 4133, a first CA ODT strap value of the memory device 4131 according to the V1 voltage and a second CA ODT strap value of each of the memory devices 4132 and 4133 according to the V2 voltage may be different. The memory controller 4240 may classify the memory device 4131 having the first CA ODT strap value as group B and may classify the memory devices 4132 and 4133 having the second CA ODT strap value as group A. The number of memory devices included in the memory module 4100 and the number of groups of memory devices classified by the memory controller 4240 are not limited to the example illustrated in FIG. 14. The memory controller 4240 may set an ODT value of each of the CA pins 1204 (refer to FIG. 6) of the memory device 4131 belonging to group B to ODT1 (e.g., RZQ/X) (X being a natural number) by issuing the mode register write command MRW. The memory controller 4240 may set an ODT value of each of the CA pins 1204 (refer to FIG. 6) of the memory devices 4132 and 4133 belonging to group A to ODT2 (e.g., RZQ/Y) (Y being a natural number different from X) different from ODT1 by issuing the mode register write command MRW. Also, the memory controller 4240 may set an ODT value of each of the CA pins 1204 (refer to FIG. 6) of the memory device 4133 to an open state (i.e., infinity) by issuing the mode register write command MRW. For example, the memory controller 4240 may allow the memory devices 4131 to 4133 to enter the PDA mode for the purpose of differently setting ODT values of the CA pins of the memory devices 4131 to 4133. The system PMIC 4300 may supply a power supply voltage to the host 4200. The system PMIC 4300 may supply the power supply voltages VIN1 and VIN2 to the memory module 4100. The power supply voltages VIN1 and VIN2 supplied by the system PMIC 4300 are not directly provided to the memory devices 4131 to 4133. Instead, the PMIC 4120 may generate the power supply voltages VDD, VDDQ, and VPP by using the power supply voltages VIN1 and VIN2, may supply the power supply voltages VDD, VDDQ, and VPP to the memory devices 4131 to 4143, and may supply the power supply voltage VDDQ to the RCD 4110.

A memory device according to one or more example embodiments may recognize its own location on a bus in a memory module to perform self-calibration, and thus, the memory device may appropriately operate even under an operation condition varying depending on a location in the memory module.

While example embodiments been described, it will be apparent to those of ordinary skill in the art that various changes and modifications may be made thereto without departing from the spirit and scope of the disclosure as set forth in the following claims.

What is claimed is:
1. A memory device of a memory module, the memory device comprising:

a command/address (CA) buffer configured to receive a CA signal through a bus shared by a second memory device of the memory module that is different from the memory device;
a mode register configured to store an on-die termination (ODT) strap value of the memory device; and
a first ODT pin connected to the mode register and configured to receive one of a first voltage or a second voltage, and provide the one of the first voltage or the second voltage to the mode register as the ODT strap value, the first voltage being different from the second voltage.

2. The memory device of claim 1, further comprising:
a first CA pin connected to the CA buffer and the bus,
wherein the ODT strap value is based on a distance from the first CA pin of the memory device to an internal pin of the memory module.

3. The memory device of claim 2, further comprising:
a first CA ODT circuit connected to the first CA pin and the CA buffer, and configured to provide a first ODT resistance value to the first CA pin based on the ODT strap value,
wherein the first ODT resistance value applied to the first CA pin is different from a second ODT resistance value applied to a second CA pin of the second memory device.

4. The memory device of claim 3, wherein a first distance from the first CA pin of the memory device to the internal pin of the memory module is greater than a second distance from the second CA pin of the second memory device to the internal pin of the memory module, and
wherein the first distance is indicated by the first voltage and the second distance is indicated by the second voltage.

5. The memory device of claim 4, wherein the internal pin of the memory module is connected to a power management integrated circuit (PMIC) of the memory module, and
wherein the first voltage and the second voltage are provided from the PMIC.

6. The memory device of claim 1, further comprising:
a calibration logic circuit configured to perform a calibration operation based on the ODT strap value of the memory device; and
an equalizer circuit connected to the CA buffer and the calibration logic circuit, and configured to adjust the CA signal.

7. The memory device of claim 6, wherein the calibration logic circuit is further configured to control the equalizer circuit based on the ODT strap value, and
wherein the equalizer circuit is configured to amplify a high frequency component of the CA signal.

8. The memory device of claim 7, wherein the CA buffer is further configured to compare voltage levels of CA signals with respect to a reference voltage and generate internal CA signals based on the reference voltage.

9. The memory device of claim 8, further comprising:
a clock buffer configured to receive a clock signal through the bus and generate an internal clock signal;
a delay circuit configured to delay the internal clock signal and generate a delay clock signal;
a sampler circuit configured to receive the internal CA signals from the CA buffer and sample the internal CA signals based on the delay clock signal provided from the delay circuit; and
a command decoder configured to receive logical values of the internal CA signals, decode a command based on the logical values of the internal CA signals, and provide a row address and a column address to a row decoder and a column decoder, respectively.

10. A memory module comprising:
a plurality of memory devices sharing a bus, the plurality of memory devices comprising a first memory device included in a first group and a second memory device included in a second group,
wherein the first memory device comprises:
a first command/address (CA) buffer configured to receive a CA signal through a first CA pin connected to the bus;
a first mode register configured to store a first on-die termination (ODT) strap value; and
a first ODT pin connected to the first mode register and configured to receive one of a first voltage or a second voltage, and provide the one of the first voltage or the second voltage to the first mode register as the ODT strap value, the first voltage being different from the second voltage, and
wherein the second memory device comprises:
a second CA buffer configured to receive the CA signal through a second CA pin connected to the bus; and
a second mode register configured to store a second ODT strap value.

11. The memory module of claim 10, further comprising:
a power management integrated circuit (PMIC) configured to supply the first voltage and the second voltage to the plurality of memory devices; and
a register clock driver (RCD) circuit configured to receive the CA signal and a clock signal, and provide the CA signal and the clock signal to the plurality of memory devices.

12. The memory module of claim 11, wherein the first ODT strap value is based on a first distance from the first CA pin of the first memory device to one of the PMIC and the RCD circuit, and
wherein the second ODT strap value is based on a second distance from the second CA pin of the second memory device to one of the PMIC and the RCD circuit.

13. The memory module of claim 12, wherein the first distance is greater than the second distance, and
wherein the first distance is indicated by the first voltage and the second distance is indicated by the second voltage.

14. The memory module of claim 12, wherein the second memory device further comprises a second ODT pin connected to the second mode register and configured to receive the one of the first voltage or the second voltage, and provide the one of the first voltage or the second voltage to the second mode register as the second ODT strap value.

15. The memory module of claim 10, wherein the first memory device further comprises a first CA ODT circuit connected to the first CA pin and the first CA buffer, and configured to provide a first ODT resistance value to the first CA pin of the first memory device based on the first ODT strap value, and
wherein the second memory device further comprises a second CA ODT circuit connected to the second CA pin and the second CA buffer, and configured to provide a second ODT resistance value to the second CA pin of the second memory device based on the second ODT strap value, the second ODT resistance value being different from the first ODT resistance value.

16. The memory module of claim 10, wherein the first CA buffer is further configured to compare voltage levels of CA signals with respect to a reference voltage and generate internal CA signals based on the reference voltage, and
wherein the first memory device further comprises:
a first calibration logic circuit configured to perform a calibration operation based on the ODT strap value; and
a first equalizer circuit connected to the first CA buffer and the first calibration logic circuit, and configured to adjust the CA signal.

17. The memory module of claim 16, wherein the first memory device further comprises:
a clock buffer configured to receive a clock signal through the bus and generate an internal clock signal;
a delay circuit configured to delay the internal clock signal and generate a delay clock signal; and
a sampler circuit configured to receive the internal CA signals from the CA buffer and sample the internal CA signals based on the delay clock signal provided from the delay circuit.

18. A memory system comprising:
a memory controller;
a memory module connected to the memory controller, the memory module comprising a plurality of memory devices sharing a bus, the plurality of memory devices comprising a first memory device included in a first group and a second memory device included in a second group,
wherein the first memory device comprises:
a first command/address (CA) buffer configured to receive a CA signal through a first CA pin connected to the bus;
a first mode register configured to store a first on-die termination (ODT) strap value; and
a first ODT pin connected to the first mode register and configured to receive one of a first voltage or a second voltage, and provide the one of the first voltage or the second voltage to the first mode register as the ODT strap value, the first voltage being different from the second voltage, and
wherein the second memory device comprises:
a second CA buffer configured to receive the CA signal through a second CA pin connected to the bus; and
a second mode register configured to store a second ODT strap value.

19. The memory system of claim 18, wherein the first ODT strap value is based on a first distance from the first CA pin of the first memory device to an internal pin of the memory module, and the second ODT strap value is based on a second distance from the second CA pin of the second memory device to the internal pin of the memory module,
wherein the first memory device further comprises a first CA ODT circuit connected to the first CA pin and the first CA buffer, and configured to provide a first ODT resistance value to the first CA pin of the first memory device, and
wherein the second memory device further comprises a second CA ODT circuit connected to the second CA pin and the second CA buffer, and configured to provide a second ODT resistance value to the second CA pin of the second memory device, the second ODT resistance value being different from the first ODT resistance value applied to the first CA pin of the first memory device.

* * * * *